United States Patent
Homsi

(10) Patent No.: US 10,750,587 B2
(45) Date of Patent: *Aug. 18, 2020

(54) LIGHTING SYSTEMS, AND SYSTEMS FOR DETERMINING PERIODIC VALUES OF A PHASE ANGLE OF A WAVEFORM POWER INPUT

(71) Applicant: EcoSense Lighting Inc., Los Angeles, CA (US)

(72) Inventor: Mustafa Homsi, Los Angeles, CA (US)

(73) Assignee: EcoSense Lighting Inc., Los Angeles, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/379,966

(22) Filed: Apr. 10, 2019

(65) Prior Publication Data

US 2019/0373697 A1   Dec. 5, 2019

Related U.S. Application Data

(63) Continuation of application No. 15/547,451, filed as application No. PCT/US2017/013636 on Jan. 16, 2017, now Pat. No. 10,306,724.

(Continued)

(51) Int. Cl.
*H05B 33/08* (2020.01)
*G01R 19/00* (2006.01)
(Continued)

(52) U.S. Cl.
CPC ........... *H05B 45/10* (2020.01); *G01R 19/003* (2013.01); *G01R 19/04* (2013.01); *G01R 25/00* (2013.01);
(Continued)

(58) Field of Classification Search
CPC .......................... H05B 33/08; H05B 33/0851; H05B 33/0809; H05B 37/02; G01R 19/003; G01R 19/04; G01R 25/00
See application file for complete search history.

(56) References Cited

U.S. PATENT DOCUMENTS 5,302,914 A * 4/1994 Arntz ........................ H03F 1/34
330/124 R
7,394,204 B1 * 7/2008 Shet ................... H05B 37/0263
315/194

(Continued)

FOREIGN PATENT DOCUMENTS

CN          1592874 A       3/2005
CN        101959346 A       1/2011
(Continued)

OTHER PUBLICATIONS

Homsi, Mustafa, PCT/US2017/013636, International Preliminary Report on Patentability dated Jul. 25, 2019, 16pp.

(Continued)

*Primary Examiner* — Thai Pham
(74) *Attorney, Agent, or Firm* — Jay M. Brown

(57) ABSTRACT

System for determining periodic values of phase angle Φ of waveform power input including voltage detector for detecting periodic values of average voltage of waveform power input and detecting corresponding periodic values of peak voltage of waveform power input. System also includes phase angle Φ detector in signal communication for receiving periodic values of average voltage and peak voltage from voltage detector. Phase angle Φ detector also detects periodic values each being ratio of one of periodic values of average voltage divided by corresponding periodic value of peak voltage, or being ratio of peak voltage divided by average voltage; and determines periodic values of phase (Continued)

angle Φ of waveform power input corresponding to periodic values of ratio. Lighting systems.

52 Claims, 12 Drawing Sheets

Related U.S. Application Data

(60) Provisional application No. 62/446,526, filed on Jan. 15, 2017.

(51) Int. Cl.
| | | |
|---|---|---|
| G01R 19/04 | (2006.01) | |
| G01R 25/00 | (2006.01) | |
| H05B 45/10 | (2020.01) | |
| G02F 1/01 | (2006.01) | |
| H05B 45/37 | (2020.01) | |
| H05B 47/10 | (2020.01) | |
| H03L 7/08 | (2006.01) | |
| H05B 39/04 | (2006.01) | |

(52) U.S. Cl.
CPC ................. *G02F 1/01* (2013.01); *H03L 7/08* (2013.01); *H05B 45/37* (2020.01); *H05B 47/10* (2020.01); *H05B 39/044* (2013.01)

(56) References Cited

U.S. PATENT DOCUMENTS

| | | | | |
|---|---|---|---|---|
| 8,400,079 B2* | 3/2013 | Kanamori | .......... | H05B 33/0809 |
| | | | | 315/194 |
| 8,502,518 B2 | 8/2013 | Piva | | |
| 8,847,515 B2 | 9/2014 | King et al. | | |
| 8,957,591 B2* | 2/2015 | Murakami | ......... | H05B 33/0815 |
| | | | | 315/185 R |
| 9,532,415 B2 | 12/2016 | King et al. | | |
| 2003/0146715 A1 | 8/2003 | Suomi | | |
| 2010/0225251 A1* | 9/2010 | Maruyama | ......... | H05B 33/0815 |
| | | | | 315/307 |
| 2011/0012530 A1* | 1/2011 | Zheng | ................ | H05B 33/0815 |
| | | | | 315/294 |
| 2013/0076248 A1* | 3/2013 | Shimizu | ............. | H05B 33/0809 |
| | | | | 315/127 |
| 2014/0191683 A1* | 7/2014 | Gaines | ............... | H05B 33/0812 |
| | | | | 315/294 |
| 2015/0022489 A1* | 1/2015 | Gossner | .................. | G06F 3/044 |
| | | | | 345/174 |

FOREIGN PATENT DOCUMENTS

| | | |
|---|---|---|
| CN | 102238786 A | 11/2011 |
| CN | 102812781 A | 12/2012 |
| CN | 103314639 A | 9/2013 |

OTHER PUBLICATIONS

Introduction to Dimming Concepts—iLumin System Commissioning Training, downloaded on Jul. 23, 2019 from https://mzltg.com/wp-content/uploads/2015/07/dimming-technologies.pdf, 10pp.
Väisänen, Esko, Different Dimming Types for LED Lighting—Arrant-Light Blog, downloaded on Mar. 26, 2019 from http://www.light.fi/blog/different-dimming-types-for-led-lighting/, 9pp.
Band Stop Filter, downloaded on Apr. 3, 2019 from https://www.electronics-tutorials.ws/filter/band-stop-filter.html, 15pp.
Commonly-owned PRC (China) patent application No. 201780083521.X, Office Action dated Mar. 30, 2020 received by Applicant dated Apr. 9, 2020; 5 pages (in Chinese, no translation).

\* cited by examiner

LIGHTING SYSTEMS, AND SYSTEMS FOR DETERMINING PERIODIC VALUES OF A PHASE ANGLE OF A WAVEFORM POWER INPUT

CROSS-REFERENCE TO RELATED APPLICATIONS

This application is a continuation of commonly-owned U.S. utility patent application Ser. No. 15/547,451 filed on Jul. 28, 2017, which is a 371 of commonly-owned PCT/US17/13636 filed on Jan. 16, 2017, which claims the benefit of commonly-owned U.S. provisional patent application Ser. No. 62/446,526 filed on Jan. 15, 2017. The entireties of the three foregoing applications hereby are incorporated herein by reference.

BACKGROUND OF THE INVENTION

1. Field of the Invention

The present invention relates to the field of lighting systems and to the field of systems for determining phase angles of a waveform power input.

2. Background of the Invention

Numerous lighting systems have been developed that include light-emitting devices. Despite the existence of these lighting systems, further improvements are still needed in lighting systems that include systems for determining phase angles of a waveform power input.

SUMMARY

In an example of an implementation, a system is provided for determining periodic values of a phase angle Φ of a waveform power input, including a voltage detector and a phase angle Φ detector. In this example of the system, the voltage detector is configured for detecting a plurality of periodic values of an average voltage ("V-ave") of a waveform power input and for detecting a corresponding plurality of periodic values of a peak voltage ("V-peak") of the waveform power input. Further in this example of the system, the phase angle Φ detector is in signal communication for receiving the periodic values of the average voltage V-ave and the peak voltage V-peak from the voltage detector. Also in this example of the system, the phase angle Φ detector is configured for: detecting a plurality of periodic values each being a ratio ("V-ap") of a one of the plurality of periodic values of the average voltage V-ave divided by the corresponding one of the plurality of periodic values of the peak voltage V-peak; and determining a plurality of periodic values of the phase angle Φ of the waveform power input each corresponding to a one of the plurality of periodic values of the ratio V-ap.

In another example of an implementation, a lighting system is provided, including: a dimmer; a power transmission circuit; a voltage detector; a phase angle Φ detector; and a power control circuit. In this example of the lighting system, the dimmer is configured for performing a phase-cutting operation on a waveform power input. Also in this example of the lighting system, the power transmission circuit is in electrical communication with the dimmer and is configured for being placed in electrical communication with a light emitter. Further in this example of the lighting system, the power transmission circuit is configured for receiving a power control signal for controlled transmission of the waveform power input to the light emitter. Additionally in this example of the lighting system, the voltage detector is configured for detecting a plurality of periodic values of an average voltage ("V-ave") of the waveform power input and for detecting a corresponding plurality of periodic values of a peak voltage ("V-peak") of the waveform power input. Additionally in this example of the lighting system, the phase angle Φ detector is in signal communication for receiving the periodic values of the average voltage V-ave and the peak voltage V-peak from the voltage detector. Also in this example of the lighting system, the phase angle Φ detector is configured for: detecting a plurality of periodic values each being a ratio ("V-ap") of a one of the plurality of periodic values of the average voltage V-ave divided by the corresponding one of the plurality of periodic values of the peak voltage V-peak; and determining a plurality of periodic values of the phase angle Φ of the waveform power input each corresponding to a one of the plurality of periodic values of the ratio V-ap. Further in this example of the lighting system, the power control circuit is configured: for utilizing the plurality of periodic values of the phase angle Φ of the waveform power input in generating the power control signal; and for sending the power control signal to the power transmission circuit.

In a further example of an implementation, another system is provided for determining periodic values of a phase angle Φ of a waveform power input, including a voltage detector and a phase angle Φ detector. In this example of the system, the voltage detector is configured for detecting a plurality of periodic values of a peak voltage ("V-peak") of a waveform power input and for detecting a corresponding plurality of periodic values of an average voltage ("V-ave") of the waveform power input. Further in this example of the system, the phase angle Φ detector is in signal communication for receiving the periodic values of the average voltage V-ave and the peak voltage V-peak from the voltage detector. Additionally in this example of the system, the phase angle Φ detector is configured for: detecting a plurality of periodic values each being a ratio ("V-pa") of a one of the plurality of periodic values of the peak voltage V-peak divided by the corresponding one of the plurality of periodic values of the average voltage V-ave; and determining a plurality of periodic values of the phase angle Φ of the waveform power input each corresponding to a one of the plurality of periodic values of the ratio V-pa.

In an additional example of an implementation, another lighting system is provided, including: a dimmer; a power transmission circuit; a voltage detector; a phase angle c detector; and a power control circuit. In this example of the lighting system, the dimmer is configured for performing a phase-cutting operation on a waveform power input. Also in this example of the lighting system, the power transmission circuit is in electrical communication with the dimmer. Further in this example of the lighting system, the power transmission circuit is configured for being placed in electrical communication with a light emitter; and is configured for receiving a power control signal for controlled transmission of the waveform power input to the light emitter. Additionally in this example of the lighting system, the voltage detector is configured for detecting a plurality of periodic values of a peak voltage ("V-peak") of the waveform power input and for detecting a corresponding plurality of periodic values of an average voltage ("V-ave") of the waveform power input. Further in this example of the lighting system, the phase angle Φ detector is in signal communication for receiving the periodic values of the average voltage V-ave and the peak voltage V-peak from the voltage detector. Also in this example of the lighting system, the phase angle Φ detector is configured for: detecting a plurality of periodic values each being a ratio ("V-pa") of a one of the plurality of periodic values of the peak voltage V-peak divided by the corresponding one of the plurality of periodic values of the average voltage V-ave; and determining a plurality of periodic values of the phase angle Φ of the waveform power input each corresponding to a one of the plurality of periodic values of the ratio V-pa. In this example of the lighting system, the power control circuit is configured: for utilizing the plurality of periodic values of the phase angle Φ of the waveform power input in generating the power control signal; and for sending the power control signal to the power transmission circuit.

In another example of an implementation, a process is provided for determining periodic values of a phase angle Φ of a waveform power input. In this example, the process includes providing a waveform power input, and detecting a plurality of periodic values of an average voltage ("V-ave") of the waveform power input, and detecting a corresponding plurality of periodic values of a peak voltage ("V-peak") of the waveform power input. In this example, the process further includes detecting a plurality of periodic values each being a ratio ("V-ap") of a one of the plurality of periodic values of the average voltage V-ave divided by the corresponding one of the plurality of periodic values of the peak voltage V-peak. In this example, the process also includes determining a plurality of periodic values of the phase angle Φ of the waveform power input each corresponding to a one of the plurality of periodic values of the ratio V-ap.

In an additional example of an implementation, a lighting process is provided, that includes providing a waveform power input; providing a dimmer being configured for performing a phase-cutting operation on the waveform power input; and providing a power transmission circuit being in electrical communication with the dimmer and with a light emitter, the power transmission circuit being configured for receiving a power control signal for controlled transmission of the waveform power input to the light emitter. This example of the lighting process further includes: detecting a plurality of periodic values of an average voltage ("V-ave") of the waveform power input and detecting a corresponding plurality of periodic values of a peak voltage ("V-peak") of the waveform power input; detecting a plurality of periodic values each being a ratio ("V-ap") of a one of the plurality of periodic values of the average voltage V-ave divided by the corresponding one of the plurality of periodic values of the peak voltage V-peak; determining a plurality of periodic values of the phase angle Φ of the waveform power input each corresponding to a one of the plurality of periodic values of the ratio V-ap; utilizing the plurality of periodic values of the phase angle Φ of the waveform power input in generating the power control signal; and sending the power control signal to the power transmission circuit.

In a further example of an implementation, another process is provided for determining periodic values of a phase angle Φ of a waveform power input. In this example, the process includes: providing a waveform power input; and detecting a plurality of periodic values of a peak voltage ("V-peak") of the waveform power input; and detecting a corresponding plurality of periodic values of an average voltage ("V-ave") of the waveform power input. In this example, the process further includes: detecting a plurality of periodic values each being a ratio ("V-pa") of a one of the plurality of periodic values of the peak voltage V-peak divided by the corresponding one of the plurality of periodic values of the average voltage V-ave; and determining a plurality of periodic values of the phase angle Φ of the waveform power input each corresponding to a one of the plurality of periodic values of the ratio V-pa.

In another example of an implementation, another lighting process is provided, that includes providing a waveform power input; providing a dimmer being configured for performing a phase-cutting operation on the waveform power input; and providing a power transmission circuit being in electrical communication with the dimmer and with a light emitter, the power transmission circuit being configured for receiving a power control signal for controlled transmission of the waveform power input to the light emitter. In this example, the lighting process further includes detecting a plurality of periodic values of a peak voltage ("V-peak") of the waveform power input and detecting a corresponding plurality of periodic values of an average voltage ("V-ave") of the waveform power input. Additionally, this example of the lighting process includes detecting a plurality of periodic values each being a ratio ("V-pa") of a one of the plurality of periodic values of the peak voltage V-peak divided by the corresponding one of the plurality of periodic values of the average voltage V-ave. This example of the lighting process further includes: determining a plurality of periodic values of the phase angle Φ of the waveform power input each corresponding to a one of the plurality of periodic values of the ratio V-pa; utilizing the plurality of periodic values of the phase angle Φ of the waveform power input in generating the power control signal; and sending the power control signal to the power transmission circuit.

Other systems, devices, processes, features and advantages of the invention will be or will become apparent to one with skill in the art upon examination of the following figures and detailed description. It is intended that all such additional systems, devices, processes, features and advantages be included within this description, be within the scope of the invention, and be protected by the accompanying claims.

BRIEF DESCRIPTION OF THE FIGURES

The invention can be better understood with reference to the following figures. The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
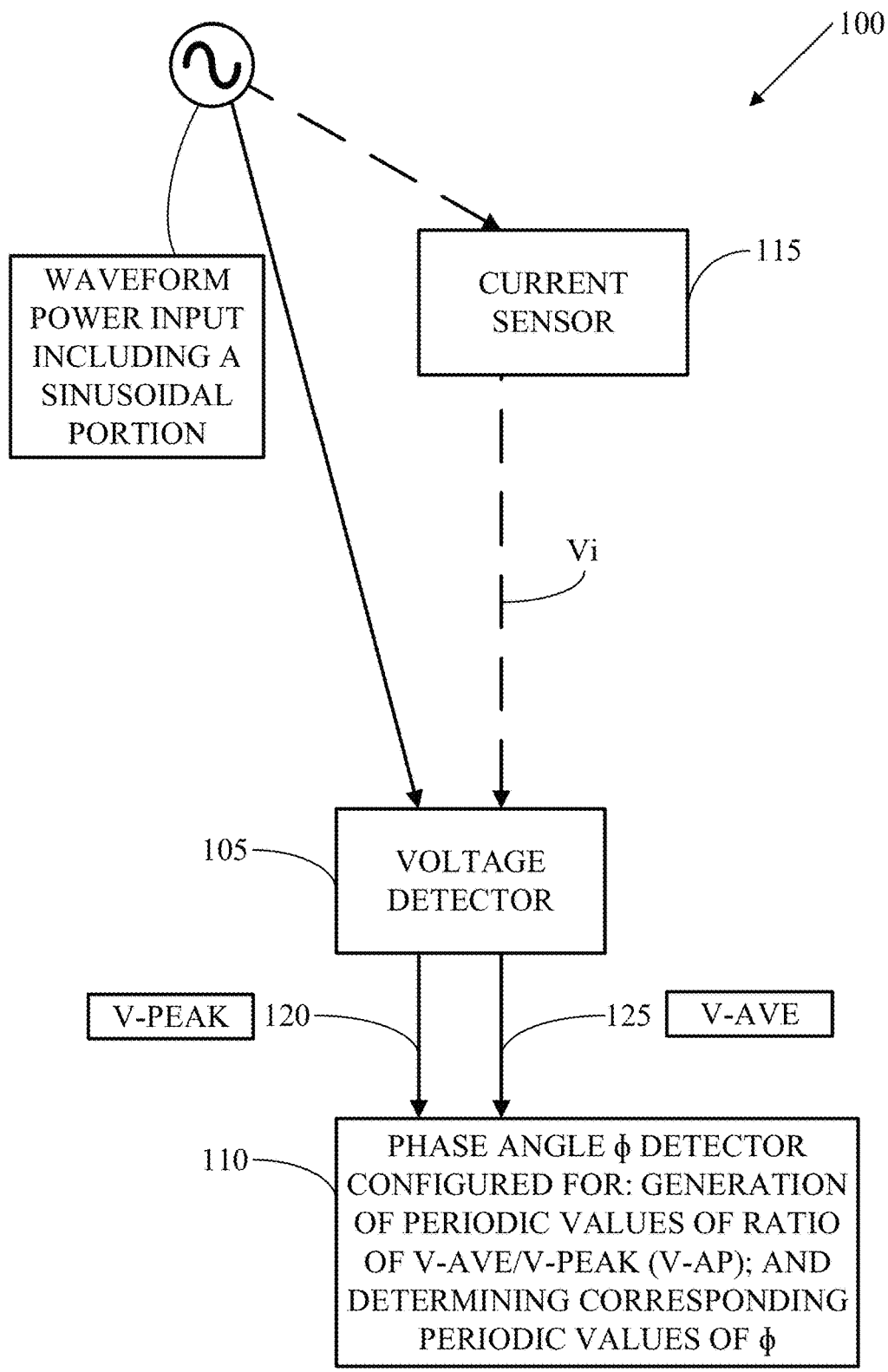
FIG. 1 is a block diagram showing an example [100] of an implementation of a system for determining periodic values of a phase angle Φ of a waveform power input P.

Various lighting systems having dimmers that operate by phase-cutting of a waveform power input have been designed. Existing lighting systems often have demonstrably failed to provide light dimming that is effectively responsive to a selected degree of dimming, because the power control signals utilized to control a power transmission circuit for operating a light emitter typically fail to be able to accurately reflect the phase angle Φ of a universal waveform power input while at the same time adequately rejecting common power line noise.

The following formula shows a relationship between the average voltage V-ave and the peak voltage V-peak of a waveform power input P that has been subjected to a phase-cutting operation by a dimmer such as a leading edge TRIAC or SCR or a trailing edge MOSFET.

$$V\text{-}ave(\Phi) = \frac{V\text{-peak}}{\pi} \cdot (1 - \text{cosine}(\Phi))$$

This formula can be rewritten as:

$$\frac{V\text{-}ave(\Phi)}{V\text{-peak}} = \frac{1 - \text{cosine}(\Phi)}{\pi}$$

For phase angles of less than 90° in an example of a half-waveform pulsating direct power input P having a pulsating cycle of 180°, a correction factor of sine Φ for V-peak is needed, since the peak voltage is not represented until the phase angle c reaches 90°, so the formula for such cases becomes:

$$\frac{V\text{-}ave(\Phi)}{V\text{-peak}} = \frac{1 - \text{cosine}(\Phi)}{\pi \cdot \text{sine}(\Phi)}$$

These formulas are used in configuration of the systems and processes herein for detecting the phase angle (Φ) of a waveform power input independently of the voltage amplitude of the power input, so that the systems and processes herein are effective with a universal line power input P having the peak voltage as being, for example, within a range of between about 85 volts (root mean squared "RMS") and about 320 volts RMS. Accordingly, the resulting systems and processes disclosed herein are highly insensitive to power line voltage noise.

In some examples, a system is accordingly provided for determining periodic values of a phase angle Φ of a waveform power input, including a voltage detector and a phase angle Φ detector. In these examples of the system, the voltage detector is configured for detecting a plurality of periodic values of an average voltage ("V-ave") of a waveform power input and for detecting a corresponding plurality of periodic values of a peak voltage ("V-peak") of the waveform power input. Further in these examples of the system, the phase angle Φ detector is in signal communication for receiving the periodic values of the average voltage V-ave and the peak voltage V-peak from the voltage detector. Also in these examples of the system, the phase angle Φ detector is configured for: detecting a plurality of periodic values each being a ratio ("V-ap") of a one of the plurality of periodic values of the average voltage V-ave divided by the corresponding one of the plurality of periodic values of the peak voltage V-peak; and determining a plurality of periodic values of the phase angle Φ of the waveform power input each corresponding to a one of the plurality of periodic values of the ratio V-ap.

In further examples, a lighting system is accordingly provided, including: a dimmer; a power transmission circuit; a voltage detector; a phase angle Φ detector; and a power control circuit. In these examples of the lighting system, the dimmer is configured for performing a phase-cutting operation on a waveform power input. Also in these examples of the lighting system, the power transmission circuit is in electrical communication with the dimmer and is configured for being placed in electrical communication with a light emitter. Further in these examples of the lighting system, the power transmission circuit is configured for receiving a power control signal for controlled transmission of the waveform power input to the light emitter. Additionally in these examples of the lighting system, the voltage detector is configured for detecting a plurality of periodic values of an average voltage ("V-ave") of the waveform power input and for detecting a corresponding plurality of periodic values of a peak voltage ("V-peak") of the waveform power input. Additionally in these examples of the lighting system, the phase angle Φ detector is in signal communication for receiving the periodic values of the average voltage V-ave and the peak voltage V-peak from the voltage detector. Also in these examples of the lighting system, the phase angle Φ detector is configured for: detecting a plurality of periodic values each being a ratio ("V-ap") of a one of the plurality of periodic values of the average voltage V-ave divided by the corresponding one of the plurality of periodic values of the peak voltage V-peak; and determining a plurality of periodic values of the phase angle Φ of the waveform power input each corresponding to a one of the plurality of periodic values of the ratio V-ap. Further in these examples of the lighting system, the power control circuit is configured: for utilizing the plurality of periodic values of the phase angle Φ of the waveform power input in generating the power control signal; and for sending the power control signal to the power transmission circuit.

The following definitions of terms, being stated as applying "throughout this specification", are hereby deemed to be incorporated throughout this specification, including but not limited to the Summary, Brief Description of the Figures, Detailed Description, and Claims.

Throughout this specification, the term "semiconductor" means: a substance, examples including a solid chemical element or compound, that can conduct electricity under some conditions but not others, making the substance a good medium for the control of electrical current.

Throughout this specification, the term "light emitter" means any light-emitting device being excitable to emit visible light by receiving a waveform power input. As examples, the term "light emitter" includes semiconductor light-emitting devices. Throughout this specification, the term "semiconductor light-emitting device" (also being abbreviated as "SLED") means: a light-emitting diode; an organic light-emitting diode; a laser diode; or any other light-emitting device having one or more layers containing inorganic and/or organic semiconductor(s). Throughout this specification, the term "light-emitting diode" (herein also referred to as an "LED") means: a two-lead semiconductor light source having an active pn-junction. As examples, an LED may include a series of semiconductor layers that may be epitaxially grown on a substrate such as, for example, a substrate that includes sapphire, silicon, silicon carbide, gallium nitride or gallium arsenide. Further, for example, one or more semiconductor p-n junctions may be formed in these epitaxial layers. When a sufficient voltage is applied across the p-n junction, for example, electrons in the n-type semiconductor layers and holes in the p-type semiconductor layers may flow toward the p-n junction. As the electrons and holes flow toward each other, some of the electrons may recombine with corresponding holes, and emit photons. The energy release is called electroluminescence, and the color of the light, which corresponds to the energy of the photons, is determined by the energy band gap of the semiconductor. As examples, a spectral power distribution of the light generated by an LED may generally depend on the particular semiconductor materials used and on the structure of the thin epitaxial layers that make up the "active region" of the device, being the area where the light is generated. As examples, an LED may have a light-emissive electroluminescent layer including an inorganic semiconductor, such as a Group III-V semiconductor, examples including: gallium nitride; silicon; silicon carbide; and zinc oxide. Throughout this specification, the term "organic light-emitting diode" (herein also referred to as an "OLED") means: an LED having a light-emissive electroluminescent layer including an organic semiconductor, such as small organic molecules or an organic polymer. It is understood throughout this specification that a semiconductor light-emitting device may include: a non-semiconductor-substrate or a semiconductor-substrate; and may include one or more electrically-conductive contact layers. Further, it is understood throughout this specification that an LED may include a substrate formed of materials such as, for example: silicon carbide; sapphire; gallium nitride; or silicon. It is additionally understood throughout this specification that a semiconductor light-emitting device may have a cathode contact on one side and an anode contact on an opposite side, or may alternatively have both contacts on the same side of the device.

Further background information regarding semiconductor light-emitting devices is provided in the following documents, the entireties of all of which hereby are incorporated by reference herein: U.S. Pat. Nos. 7,564,180; 7,456,499; 7,213,940; 7,095,056; 6,958,497; 6,853,010; 6,791,119; 6,600,175; 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862; and 4,918,497; and U.S. Patent Application Publication Nos. 2014/0225511; 2014/0078715; 2013/0241392; 2009/0184616; 2009/0080185; 2009/0050908; 2009/0050907; 2008/0308825; 2008/0198112; 2008/0179611; 2008/0173884; 2008/0121921; 2008/0012036; 2007/0253209; 2007/0223219; 2007/0170447; 2007/0158668; 2007/0139923; and 2006/0221272.

Throughout this specification, the term "configured" means "set up for operation especially in a particular way."

It is understood throughout this specification that numbering of the names of elements as being "first", "second" etcetera, is solely for purposes of clarity in referring to such elements in connection with various examples of lighting systems.

Throughout this specification, the term "power control circuit" means: a device being suitable for generating a "power control signal" for controlling the transmission of a waveform power input to one or more light emitters. As examples, a power control circuit may include a microprocessor; and may function by: constant current reduction (CCR); constant voltage (CV); or pulse-width-modulation (PWM). Throughout this specification, it is understood that the term "microprocessor" means a multipurpose, programmable device that accepts digital data as input, and processes the digital data according to instructions stored in the programmable device's memory, and provides results as output. Throughout this specification, the term "power transmission circuit" means: a device being suitable for transmitting a waveform power input to one or more light emitters. As examples, a power transmission circuit may have conductors for transmitting the waveform power input, being electrically connected with the light emitters. As further examples, a power transmission circuit may include: (1) one or more electrical components employed in converting electrical power (e.g., from AC to DC and/or from one voltage to another voltage); (2) one or more electronic components employed in driving one or more light emitters, e.g., running one or more light emitters intermittently and/or adjusting the waveform power input as supplied to one or more of the light emitters in response to a user command such as a dimmer command, or a command received from the power control circuit; (3) one or more circuit boards (e.g., a metal core circuit board) for supporting and/or providing waveform power input to light emitters or any other electrical components, and/or (4) one or more wires connecting any auxiliary electrical components, such as bridge rectifiers, transformers, or power factor con troll ers.

Throughout this specification, the term "signal communication" means communication of an electronic control signal or an electromagnetic radiation control signal.

Figure 2:
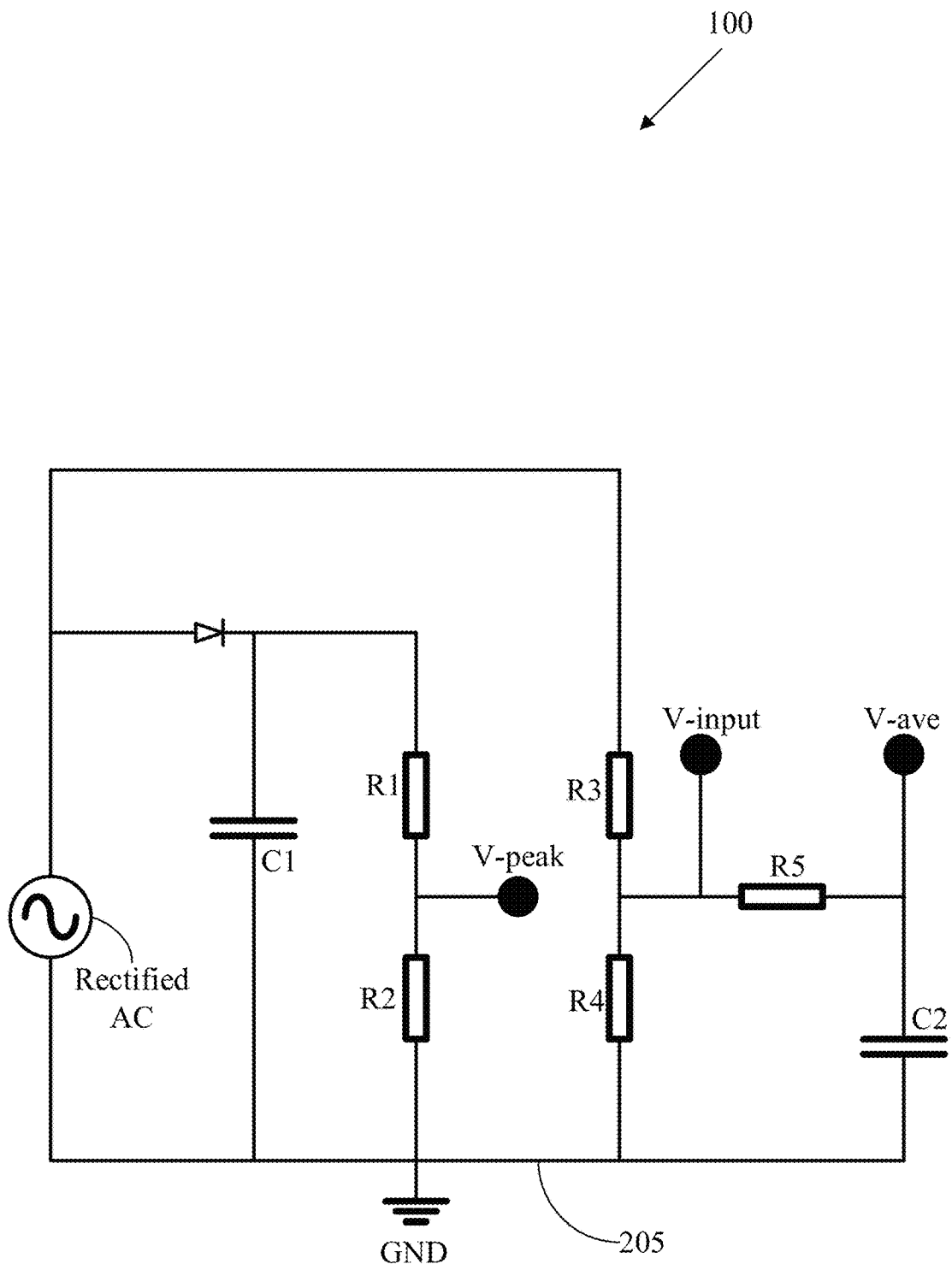
FIG. 2 is a schematic diagram of an example [205] of a circuit that may be included in the example [100] of the system for determining periodic values of a phase angle Φ.

FIG. 1 is a block diagram showing an example [100] of an implementation of a system for determining periodic values of a phase angle Φ of a waveform power input P. FIG. 2 is a schematic diagram of an example [205] of a circuit that may be included in the example [100] of the system for determining periodic values of a phase angle Φ. It is understood throughout this specification that an example [100] of a system may include any combination of the features that are discussed herein in connection with the examples [100], [300], [500], [700] of systems. Accordingly, the entireties of the discussions herein of the other examples [300], [500], [700] of systems are hereby incorporated in this discussion of the examples [100] of the systems.

As shown in FIG. 1, the example [100] of the implementation of the system for determining periodic values of a phase angle Φ includes a voltage detector [105] and a phase angle Φ detector [110]. In the example [100] of the system for determining periodic values of a phase angle Φ, the voltage detector [105] is configured for detecting a plurality of periodic values of an average voltage ("V-ave") of the waveform power input P and for detecting a corresponding plurality of periodic values of a peak voltage ("V-peak") of the waveform power input P.

In some examples [100] of the implementation of the system for determining periodic values of a phase angle Φ, the voltage detector [105] may be configured for detecting the plurality of periodic values of the average voltage V-ave and the corresponding plurality of periodic values of the peak voltage V-peak with the waveform power input P as being a phase-cut waveform power input P. In additional examples [100] of the implementation of the system for determining periodic values of a phase angle Φ, the voltage detector [105] may be configured for detecting the plurality of periodic values of the average voltage V-ave and the corresponding plurality of periodic values of the peak voltage V-peak with the waveform power input P as being a leading edge phase-cut waveform power input or a trailing edge phase-cut waveform power input P. In further examples [100] of the implementation of the lighting system, the dimmer [130] may include: a TRIAC; a silicon-controlled rectifier (SCR); a MOSFET; or an insulated gate bipolar transistor (IGBT).

In further examples [100] of the implementation of the system for determining periodic values of a phase angle Φ, the voltage detector [105] may be configured for detecting the plurality of periodic values of the average voltage V-ave and the corresponding plurality of periodic values of the peak voltage V-peak with the waveform power input P as being a half-waveform pulsating direct power input P. In other examples [100] of the implementation of the system for determining periodic values of a phase angle Φ, the voltage detector [105] may be configured for detecting the plurality of periodic values of the average voltage V-ave and the corresponding plurality of periodic values of the peak voltage V-peak with the half-waveform pulsating direct power input P as being rectified from a full-waveform sinusoidal alternating power input P. In some examples [100] of the implementation of the system for determining periodic values of a phase angle Φ, the voltage detector [105] may be configured for detecting the plurality of periodic values of the average voltage V-ave and the corresponding plurality of periodic values of the peak voltage V-peak with the waveform power input P as being a universal line power input P having the peak voltage as being within a range of between about 85 volts (root mean squared "RMS") and about 320 volts RMS. In additional examples [100] of the implementation of the system for determining periodic values of a phase angle Φ, the voltage detector [105] may include a current sensor [115] for converting the waveform power input P into a voltage signal Vi. As examples, the current sensor [115] may include a series resistor or a Hall Effect sensor.

As an example [100] of the implementation of the system for determining periodic values of a phase angle Φ, the voltage detector [105] may include a circuit [205] as shown in FIG. 2. In the example of the circuit [205] shown in FIG. 2, a voltage input Vi to be detected may be received; a peak voltage may be output at V-peak; and an average voltage may be output at V-ave. In the example [100] of the system for determining periodic values of a phase angle Φ, the example of the circuit [205] may further include five resistors $R_1$, $R_2$, $R_3$, $R_4$ and $R_5$; two capacitors $C_1$, $C_2$; a path GND to ground; and a half-waveform pulsating direct power supply P.

In the examples [100] of the implementation of the system for determining periodic values of a phase angle Φ, the phase angle Φ detector [110] is in wired or wireless signal communication with the voltage detector [105], as represented by arrows [120], [125], for receiving the periodic V-peak voltage values and the periodic V-ave voltage values from the voltage detector [105]. In the examples [100] of the implementation of the system for determining periodic values of a phase angle Φ, the phase angle Φ detector [110] is configured for detecting a plurality of periodic values each being a ratio ("V-ap") of a one of the plurality of periodic values of the average voltage V-ave divided by the corresponding one of the plurality of periodic values of the peak voltage V-peak. Additionally in the examples [100] of the implementation of the system for determining periodic values of a phase angle Φ, the phase angle Φ detector [110] is configured for determining a plurality of periodic values of the phase angle Φ of the waveform power input each corresponding to a one of the plurality of periodic values of the ratio V-ap.

In some examples [100] of the implementation of the system for determining periodic values of a phase angle Φ, the phase angle Φ detector [110] may be configured for determining the plurality of periodic values of the phase angle Φ of the waveform power input P by pairing each one of the plurality of detected periodic values of the ratio V-ap with a closely-matching one of a plurality of calculated periodic values for the ratio V-ap being determined for a plurality of corresponding periodic values of the phase angle Φ according to the following formulas:

Formula 1

$$\text{for periodic phase angles } \Phi \text{ being} < 90°, \; V\text{-}ap = \frac{1 - (\text{cosine}\Phi)}{\pi \cdot (\text{sine}\Phi)}$$

Formula 2

$$\text{for periodic phase angles } \Phi \text{ being} \geq 90°, \; V\text{-}ap = \frac{1 - (\text{cosine}\Phi)}{\pi}$$

In additional examples [100] of the implementation of the system for determining periodic values of a phase angle Φ, the phase angle Φ detector [110] may be configured for pairing each one of the plurality of detected periodic values of the ratio V-ap with the closely-matching one of the plurality of calculated periodic values for the ratio V-ap by using a lookup table of the plurality of calculated periodic values for the ratio V-ap being determined for the plurality of corresponding periodic values of the phase angle Φ according to Formulas 1 and 2.

As an example [100] of the implementation of the system for determining periodic values of a phase angle Φ, the phase angle Φ detector [110] may be configured for pairing each one of the plurality of detected periodic values of the ratio V-ap with the closely-matching one of the plurality of calculated periodic values for the ratio V-ap by using the following Lookup Table I of a plurality of calculated periodic values for the ratio V-ap being determined for the plurality of corresponding periodic values of the phase angle Φ according to Formulas 1 and 2.

TABLE I

| | LOOKUP | | |
|---|---|---|---|
| Phase Angle in Degrees | Sin Phi | Cos Phi | Ratio Vave/Vpeak |
| 0 | 0.00000000 | 1.00000000 | 0.00000000 |
| 10 | 0.17364818 | 0.98480775 | 0.02784851 |
| 20 | 0.34202014 | 0.93969262 | 0.05612662 |
| 30 | 0.50000000 | 0.86602540 | 0.08529088 |
| 40 | 0.64278761 | 0.76604444 | 0.11585532 |

TABLE I-continued

LOOKUP

| Phase Angle in Degrees | Sin Phi | Cos Phi | Ratio Vave/Vpeak |
|---|---|---|---|
| 50 | 0.76604444 | 0.64278761 | 0.14843034 |
| 60 | 0.86602540 | 0.50000000 | 0.18377630 |
| 70 | 0.93969262 | 0.34202014 | 0.22882980 |
| 80 | 0.98480775 | 0.17364818 | 0.26729191 |
| 90 | 1.00000000 | 0.00000000 | 0.31830988 |
| 100 | 0.98480775 | −0.17364818 | 0.37358381 |
| 110 | 0.93969262 | −0.34202014 | 0.42717827 |
| 120 | 0.86602540 | −0.50000000 | 0.47746482 |
| 130 | 0.76604444 | −0.64278761 | 0.52291553 |
| 140 | 0.64278761 | −0.76604444 | 0.56214940 |
| 150 | 0.50000000 | −0.86602540 | 0.59397432 |
| 160 | 0.34202014 | −0.93969262 | 0.61742333 |
| 170 | 0.17364818 | −0.98480775 | 0.63178392 |
| 180 | 0.00000000 | −1.00000000 | 0.63661977 |

In this example [100] of the implementation of the system for determining periodic values of a phase angle Φ, Lookup Table I includes calculated periodic values for the ratio V-ap being determined according to Formulas 1 and 2 for corresponding periodic values of the phase angle Φ within a range of between zero radial degrees (0°) and 180° in periods each spanning 10°. Further in this example [100] of the implementation of the system for determining periodic values of a phase angle Φ, the phase angle Φ detector [110] may pair each one of the plurality of detected periodic values of the ratio V-ap with a closely-matching one of the plurality of calculated periodic values for the ratio V-ap included in the Lookup Table I. Additionally in this example [100] of the implementation of the system for determining periodic values of a phase angle Φ, the phase angle Φ detector [110] may pair each one of the plurality of detected periodic values of the ratio V-ap with a most closely-matching one of the plurality of calculated periodic values for the ratio V-ap included in the Lookup Table I. As further examples [100] of the implementation of the system for determining periodic values of a phase angle Φ, another Lookup Table may be likewise generated as including calculated periodic values for the ratio V-ap being determined according to Formulas 1 and 2 for corresponding periodic values of the phase angle Φ spanning a range of between zero radial degrees 0° and 180° in periods each spanning a range of phase angles t much smaller than 10°. In additional examples [100] of the implementation of the system for determining periodic values of a phase angle Φ, so generating a Lookup Table as including calculated periodic values for the ratio V-ap being determined according to Formulas 1 and 2 for corresponding periodic values of the phase angle Φ spanning a range of between 0° and 180° in periods each being much smaller range than 10° may facilitate determining the periodic values of a phase angle Φ with accordingly increased accuracy.

As another example [100] of the implementation of the system for determining periodic values of a phase angle Φ, the phase angle Φ detector [110] may be configured for determining the plurality of periodic values of the phase angle Φ of the waveform power input P by: iteratively determining a plurality of calculated periodic values for the ratio V-ap according to the following Formulas 1 and 2 for a plurality of corresponding periodic values of the phase angle Φ; and pairing each one of the plurality of detected periodic values of the ratio V-ap with a closely-matching one of the plurality of calculated periodic values for the ratio V-ap:

$$\text{for periodic phase angles } \Phi \text{ being} < 90°, V\text{-}ap = \frac{1 - \text{cosine}(\Phi)}{\pi(\text{sine}\Phi)} \quad \text{Formula 1}$$

$$\text{for periodic phase angles } \Phi \text{ being} \geq 90°, V\text{-}ap = \frac{1 - (\text{cosine}\Phi)}{\pi} \quad \text{Formula 2}$$

Figure 3:
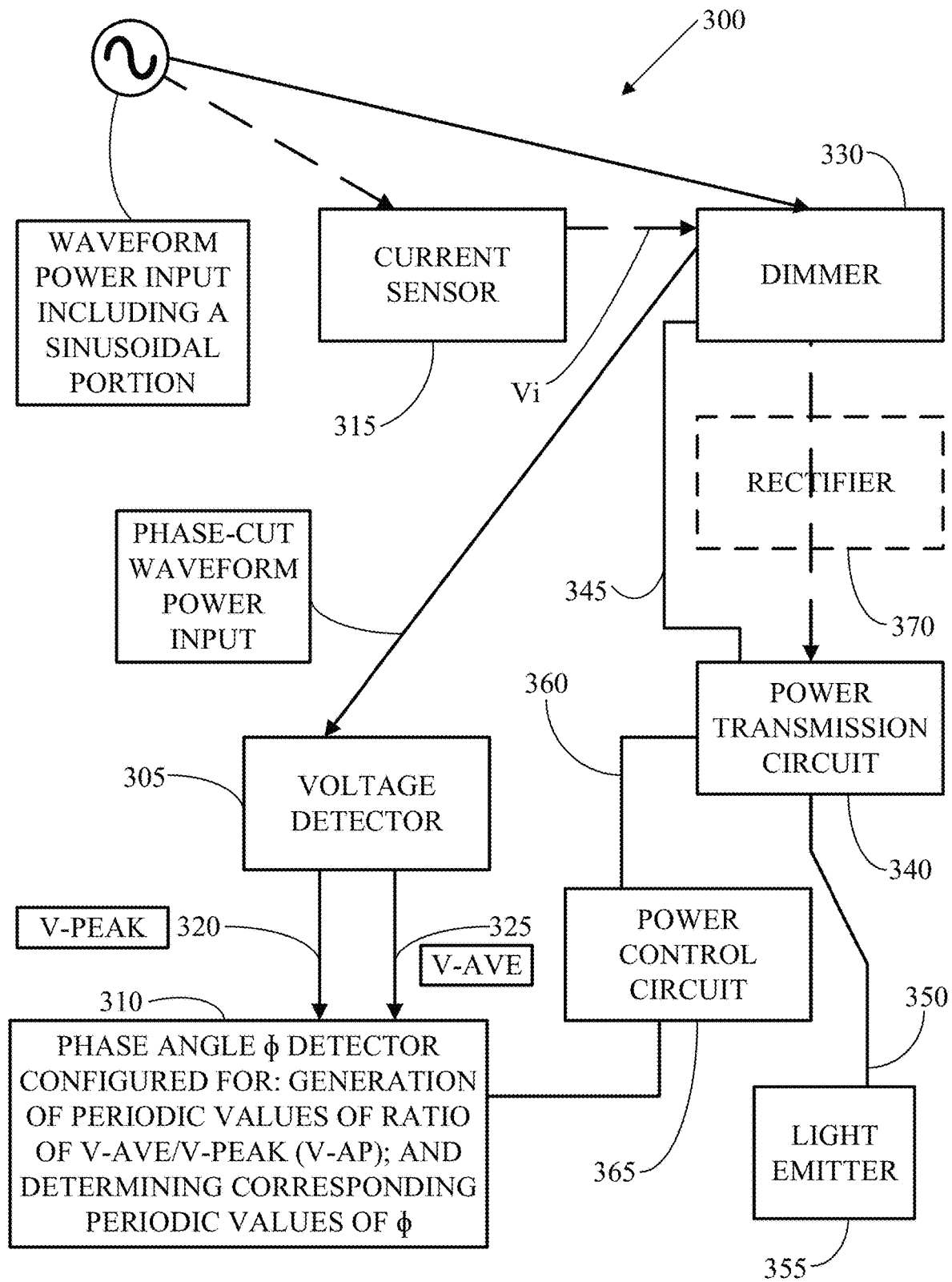
FIG. 3 is a block diagram showing an example [300] of an implementation of a lighting system.
Figure 4:
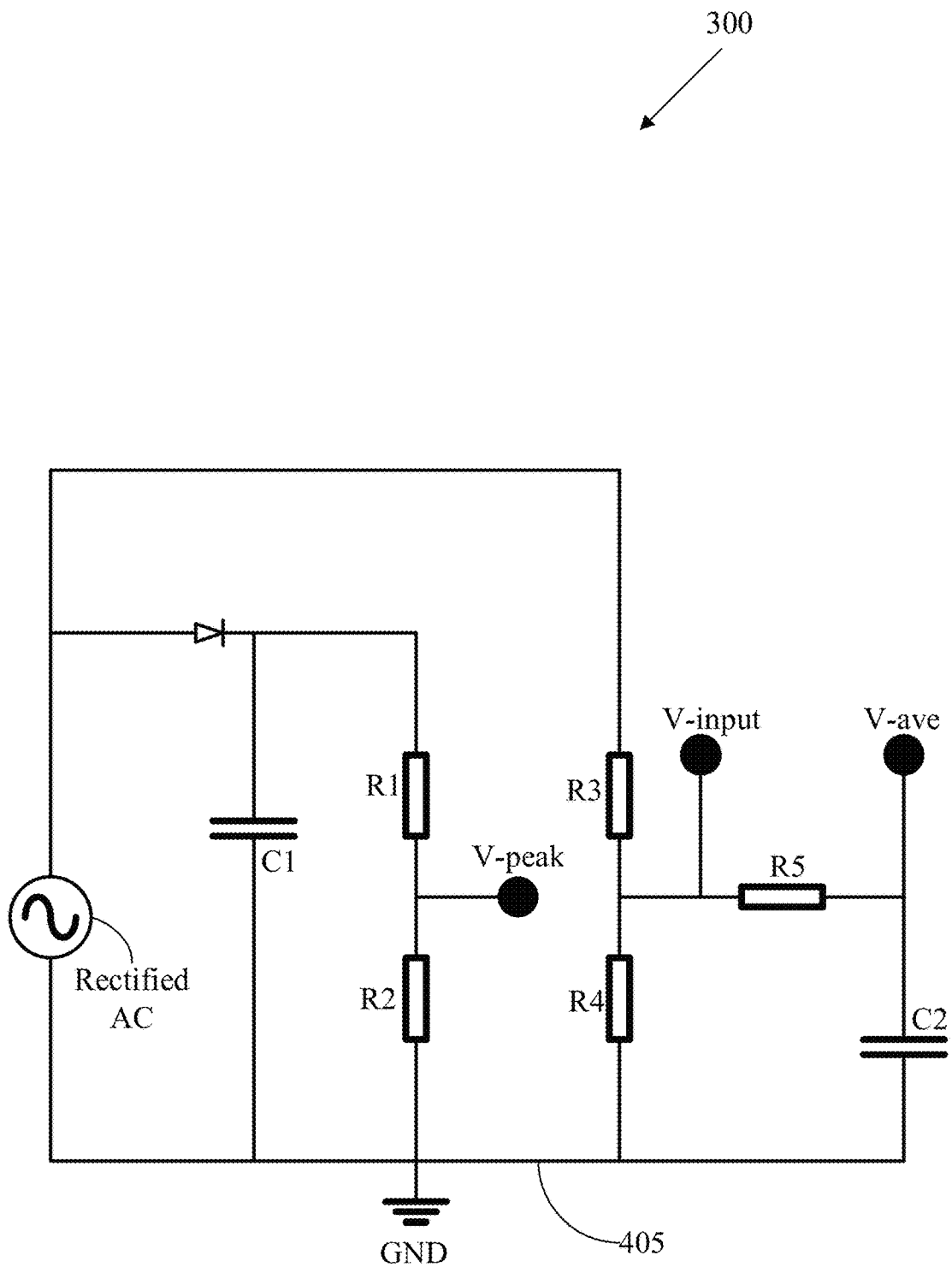
FIG. 4 is a schematic diagram of an example [405] of a circuit that may be included in the example [300] of the lighting system.

FIG. 3 is a block diagram showing an example [300] of an implementation of a lighting system. FIG. 4 is a schematic diagram of an example [405] of a circuit that may be included in the example [300] of the lighting system. It is understood throughout this specification that an example [300] of a system may include any combination of the features that are discussed herein in connection with the examples [100], [300], [500], [700] of systems. Accordingly, the entireties of the discussions herein of the other examples [100], [500], [700] of systems are hereby incorporated in this discussion of the examples [300] of the systems.

As shown in FIG. 3, the example [300] of the implementation of the lighting system includes a dimmer [330] being configured for performing a phase-cutting operation on a waveform power input P. The example [300] of the implementation of the lighting system also includes a power transmission circuit [340] being in electrical communication as represented by an arrow [345] with the dimmer [330] and is configured for being placed in electrical communication as represented by an arrow [350] with a light emitter [355]. In some examples, the example [300] of the lighting system may include the light emitter [355]. In further examples of the example [300] of the lighting system, the power transmission circuit [340] may include a switched mode power supply, a resonant converter, or a linear regulator. In the example [300] of the implementation of the lighting system, the power transmission circuit [340] is configured for receiving a wired or wireless power control signal represented by an arrow [360] for controlled transmission of the waveform power input P to the light emitter [355]. The example [300] of the implementation of the lighting system additionally includes a voltage detector [305] and a phase angle Φ detector [310]. In the example [300] of the lighting system, the voltage detector [305] is configured for detecting a plurality of periodic values of an average voltage ("V-ave") of the waveform power input P and for detecting a corresponding plurality of periodic values of a peak voltage ("V-peak") of the waveform power input P.

In some examples [300] of the implementation of the lighting system, the voltage detector [305] may be configured for detecting the plurality of periodic values of the average voltage V-ave and the corresponding plurality of periodic values of the peak voltage V-peak with the waveform power input P as being a phase-cut waveform power input P.

In examples [300] of the implementation of the lighting system, the dimmer [330] may be configured for performing either a leading edge phase cut operation or a trailing edge phase cut operation on the waveform power input P; and the voltage detector [305] may be configured for detecting the plurality of periodic values of the average voltage V-ave and the corresponding plurality of periodic values of the peak voltage V-peak with the waveform power input P as respectively being either a leading edge phase-cut waveform power input or a trailing edge phase-cut waveform power input P. In further examples [300] of the implementation of the lighting system, the dimmer [330] may include: a TRIAC; a silicon-controlled rectifier (SCR); a MOSFET; or an insulated gate bipolar transistor (IGBT).

In further examples [300] of the implementation of the lighting system, the voltage detector [305] may be configured for detecting the plurality of periodic values of the average voltage V-ave and the corresponding plurality of periodic values of the peak voltage V-peak with the waveform power input P as being a half-waveform pulsating direct power input P. In other examples [300] of the implementation of the lighting system, the voltage detector [305] may be configured for detecting the plurality of periodic values of the average voltage V-ave and the corresponding plurality of periodic values of the peak voltage V-peak with the half-waveform pulsating direct power input P as being rectified from a full-waveform sinusoidal alternating power input P. In some examples, the example [300] of the implementation of the lighting system may include a full-wave rectifier [370] being in electrical communication with the dimmer [330] and the power transmission circuit [340].

In some examples [300] of the implementation of the lighting system, the voltage detector [305] may be configured for detecting the plurality of periodic values of the average voltage V-ave and the corresponding plurality of periodic values of the peak voltage V-peak with the waveform power input P as being a universal line power input P having the peak voltage as being within a range of between about 85 volts (root mean squared "RMS") and about 320 volts RMS. In additional examples [300] of the implementation of the lighting system, the voltage detector [305] may include a current sensor [315] for converting the waveform power input P into a voltage signal Vi. As examples, the current sensor [315] may include a series resistor or a Hall Effect sensor.

As an example [300] of the implementation of the lighting system, the voltage detector [305] may include a circuit [405] as shown in FIG. 4. In the example of the circuit [405] shown in FIG. 4, a voltage input Vi to be detected may be received; a peak voltage may be output at V-peak; and an average voltage may be output at V-ave. In the example [300] of the lighting system, the example of the circuit [405] may further include five resistors $R_1$, $R_2$, $R_3$, $R_4$ and $R_5$; two capacitors $C_1$, $C_2$; a path GND to ground; and a half-waveform pulsating direct power supply P.

In the examples [300] of the implementation of the lighting system, the phase angle Φ detector [310] is in wired or wireless signal communication with the voltage detector [305], as represented by arrows [320], [325], for receiving the periodic V-peak voltage values and the periodic V-ave voltage values from the voltage detector [305]. In the examples [300] of the implementation of the lighting system, the phase angle Φ detector [310] is configured for detecting a plurality of periodic values each being a ratio ("V-ap") of a one of the plurality of periodic values of the average voltage V-ave divided by the corresponding one of the plurality of periodic values of the peak voltage V-peak. Additionally in the examples [300] of the implementation of the lighting system, the phase angle Φ detector [310] is configured for determining a plurality of periodic values of the phase angle Φ of the waveform power input each corresponding to a one of the plurality of periodic values of the ratio V-ap.

The examples [300] of the implementation of the lighting system additionally include a power control circuit [365], being configured for utilizing the plurality of periodic values of the phase angle Φ of the waveform power input in generating the power control signal. In the examples [300] of the implementation of the lighting system, the power control circuit [365] is configured for sending the power control signal [360] to the power transmission circuit [340]. In some examples [300] of the implementation of the lighting system, the power control circuit [365] may be in wired or wireless control signal communication as represented by the arrow [360] for sending the power control signal [360] to the power transmission circuit [340].

In some examples [300] of the implementation of the system for determining periodic values of a phase angle Φ, the phase angle Φ detector [310] may be configured for determining the plurality of periodic values of the phase angle Φ of the waveform power input P by pairing each one of the plurality of detected periodic values of the ratio V-ap with a closely-matching one of a plurality of calculated periodic values for the ratio V-ap being determined for a plurality of corresponding periodic values of the phase angle c according to the following formulas:

for periodic phase angles Φ being < 90°,     Formula 1
$$V\text{-}ap = \frac{1 - (\text{cosine}\,\Phi)}{\pi(\text{sine}\,\Phi)}$$

for periodic phase angles Φ being ≥ 90°,     Formula 2
$$V\text{-}ap = \frac{1 - (\text{cosine}\,\Phi)}{\pi}$$

In additional examples [300] of the implementation of the system for determining periodic values of a phase angle Φ, the phase angle Φ detector [310] may be configured for pairing each one of the plurality of detected periodic values of the ratio V-ap with the closely-matching one of the plurality of calculated periodic values for the ratio V-ap by using a lookup table of the plurality of calculated periodic values for the ratio V-ap being determined for the plurality of corresponding periodic values of the phase angle Φ according to Formulas 1 and 2.

As an example [300] of the implementation of the system for determining periodic values of a phase angle Φ, the phase angle Φ detector [310] may be configured for pairing each one of the plurality of detected periodic values of the ratio V-ap with the closely-matching one of the plurality of calculated periodic values for the ratio V-ap by using the following Lookup Table II of a plurality of calculated periodic values for the ratio V-ap being determined for the plurality of corresponding periodic values of the phase angle Φ according to Formulas 1 and 2.

TABLE II

LOOKUP

| Phase Angle in Degrees | Sin Phi | Cos Phi | Ratio Vave/Vpeak |
|---|---|---|---|
| 0 | 0.00000000 | 1.00000000 | 0.00000000 |
| 10 | 0.17364818 | 0.98480775 | 0.02784851 |
| 20 | 0.34202014 | 0.93969262 | 0.05612662 |
| 30 | 0.50000000 | 0.86602540 | 0.08529088 |
| 40 | 0.64278761 | 0.76604444 | 0.11585532 |
| 50 | 0.76604444 | 0.64278761 | 0.14843034 |
| 60 | 0.86602540 | 0.50000000 | 0.18377630 |
| 70 | 0.93969262 | 0.34202014 | 0.22882980 |
| 80 | 0.98480775 | 0.17364818 | 0.26729191 |
| 90 | 1.00000000 | 0.00000000 | 0.31830988 |
| 100 | 0.98480775 | −0.17364818 | 0.37358381 |
| 110 | 0.93969262 | −0.34202014 | 0.42717827 |
| 120 | 0.86602540 | −0.50000000 | 0.47746482 |
| 130 | 0.76604444 | −0.64278761 | 0.52291553 |
| 140 | 0.64278761 | −0.76604444 | 0.56214940 |

TABLE II-continued

LOOKUP

| Phase Angle in Degrees | Sin Phi | Cos Phi | Ratio Vave/Vpeak |
|---|---|---|---|
| 150 | 0.50000000 | −0.86602540 | 0.59397432 |
| 160 | 0.34202014 | −0.93969262 | 0.61742333 |
| 170 | 0.17364818 | −0.98480775 | 0.63178392 |
| 180 | 0.00000000 | −1.00000000 | 0.63661977 |

In this example [300] of the implementation of the system for determining periodic values of a phase angle Φ, Lookup Table II includes calculated periodic values for the ratio V-ap being determined according to Formulas 1 and 2 for corresponding periodic values of the phase angle Φ within a range of between zero radial degrees (0°) and 180° in periods each spanning 10°. Further in this example [300] of the implementation of the system for determining periodic values of a phase angle Φ, the phase angle Φ detector [310] may pair each one of the plurality of detected periodic values of the ratio V-ap with a closely-matching one of the plurality of calculated periodic values for the ratio V-ap included in the Lookup Table II. Additionally in this example [300] of the implementation of the system for determining periodic values of a phase angle Φ, the phase angle Φ detector [310] may pair each one of the plurality of detected periodic values of the ratio V-ap with a most closely-matching one of the plurality of calculated periodic values for the ratio V-ap included in the Lookup Table II. As further examples [300] of the implementation of the system for determining periodic values of a phase angle Φ, another Lookup Table may be likewise generated as including calculated periodic values for the ratio V-ap being determined according to Formulas 1 and 2 for corresponding periodic values of the phase angle Φ spanning a range of between zero radial degrees 0° and 180° in periods each spanning a range of phase angles t much smaller than 10°. In additional examples [300] of the implementation of the system for determining periodic values of a phase angle Φ, so generating a Lookup Table as including calculated periodic values for the ratio V-ap being determined according to Formulas 1 and 2 for corresponding periodic values of the phase angle Φ spanning a range of between 0° and 180° in periods each being much smaller range than 10° may facilitate determining the periodic values of a phase angle Φ with accordingly increased accuracy.

As another example [300] of the implementation of the system for determining periodic values of a phase angle Φ, the phase angle Φ detector [310] may be configured for determining the plurality of periodic values of the phase angle Φ of the waveform power input P by: iteratively determining a plurality of calculated periodic values for the ratio V-ap according to the following Formulas 1 and 2 for a plurality of corresponding periodic values of the phase angle Φ; and pairing each one of the plurality of detected periodic values of the ratio V-ap with a closely-matching one of the plurality of calculated periodic values for the ratio V-ap:

for periodic phase angles Φ being < 90°, Formula 1

$$V\text{-}ap = \frac{1 - (\text{cosine}\,\Phi)}{\pi(\text{sine}\,\Phi)}$$

for periodic phase angles Φ being ≥ 90°, Formula 2

$$V\text{-}ap = \frac{1 - (\text{cosine}\,\Phi)}{\pi}$$

Figure 5:
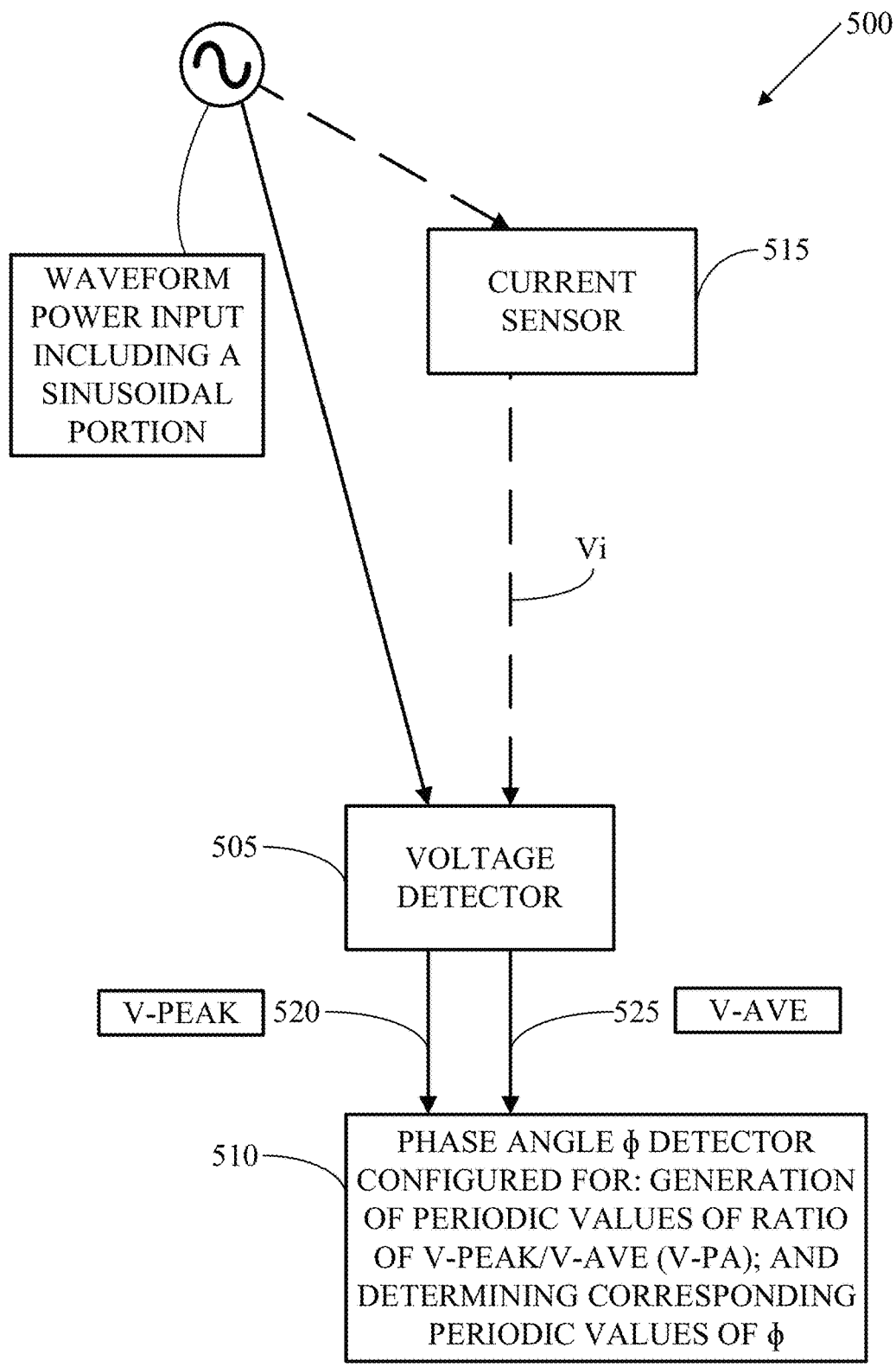
FIG. 5 is a block diagram showing an example [500] of another implementation of a system for determining periodic values of a phase angle Φ of a waveform power input P.
Figure 6:
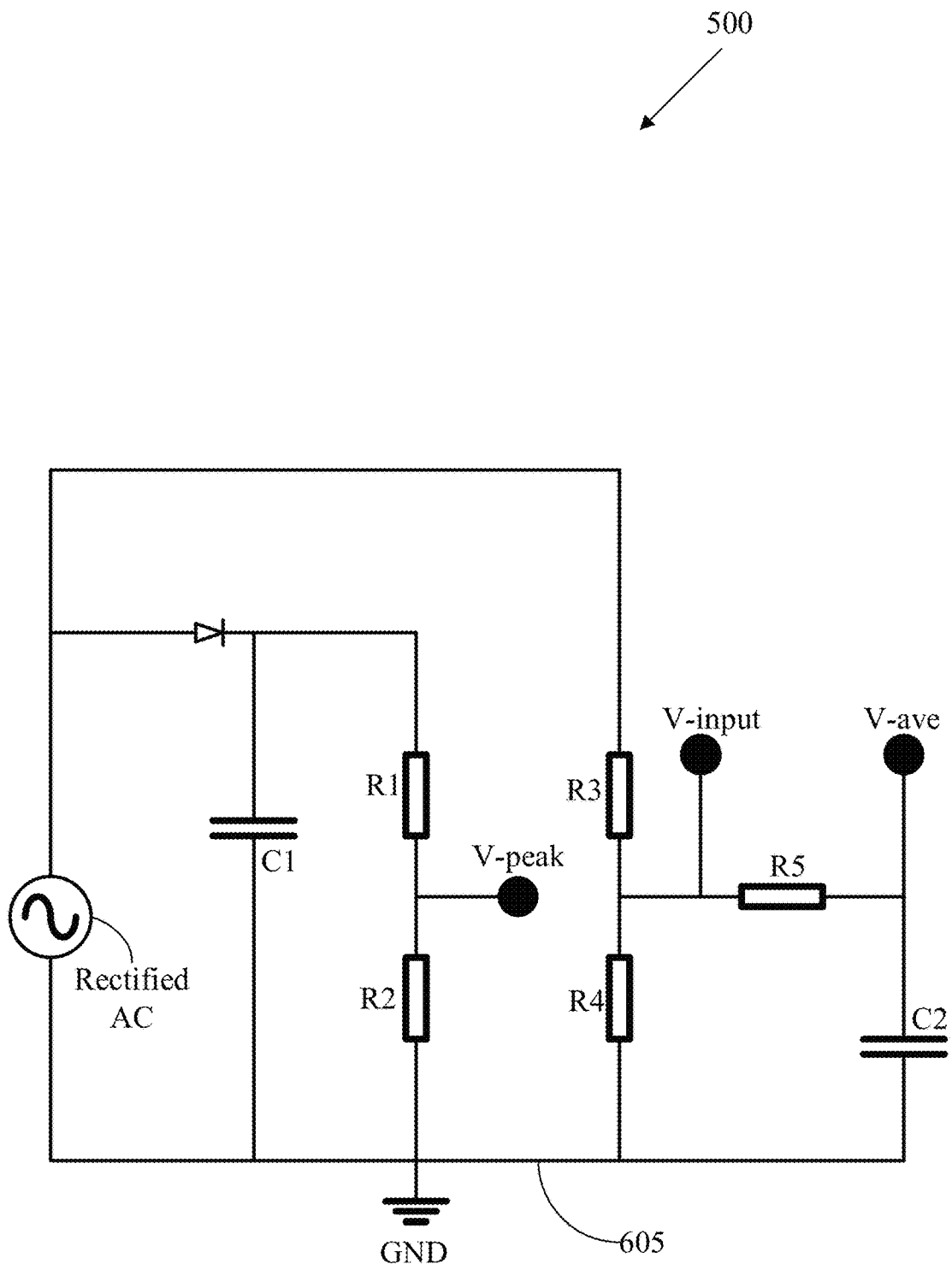
FIG. 6 is a schematic diagram of an example [605] of a circuit that may be included in the example [500] of the system for determining periodic values of a phase angle Φ.

FIG. 5 is a block diagram showing an example [500] of another implementation of a system for determining periodic values of a phase angle Φ of a waveform power input P. FIG. 6 is a schematic diagram of an example [605] of a circuit that may be included in the example [500] of the system for determining periodic values of a phase angle Φ. It is understood throughout this specification that an example [500] of a system may include any combination of the features that are discussed herein in connection with the examples [100], [300], [500], [700] of systems. Accordingly, the entireties of the discussions herein of the other examples [100], [300], [700] of systems are hereby incorporated in this discussion of the examples [500] of the systems.

As shown in FIG. 5, the example [500] of the implementation of the system for determining periodic values of a phase angle Φ includes a voltage detector [505] and a phase angle Φ detector [510]. In the example [500] of the system for determining periodic values of a phase angle Φ, the voltage detector [505] is configured for detecting a plurality of periodic values of an average voltage ("V-ave") of the waveform power input P and for detecting a corresponding plurality of periodic values of a peak voltage ("V-peak") of the waveform power input P.

In some examples [500] of the implementation of the system for determining periodic values of a phase angle Φ, the voltage detector [505] may be configured for detecting the plurality of periodic values of the average voltage V-ave and the corresponding plurality of periodic values of the peak voltage V-peak with the waveform power input P as being a phase-cut waveform power input P. In additional examples [500] of the implementation of the system for determining periodic values of a phase angle Φ, the voltage detector [505] may be configured for detecting the plurality of periodic values of the average voltage V-ave and the corresponding plurality of periodic values of the peak voltage V-peak with the waveform power input P as being a leading edge phase-cut waveform power input or a trailing edge phase-cut waveform power input P. In further examples [500] of the implementation of the lighting system, the dimmer [530] may include: a TRIAC; a silicon-controlled rectifier (SCR); a MOSFET; or an insulated gate bipolar transistor (IGBT).

In further examples [500] of the implementation of the system for determining periodic values of a phase angle Φ, the voltage detector [505] may be configured for detecting the plurality of periodic values of the average voltage V-ave and the corresponding plurality of periodic values of the peak voltage V-peak with the waveform power input P as being a half-waveform pulsating direct power input P. In other examples [500] of the implementation of the system for determining periodic values of a phase angle Φ, the voltage detector [505] may be configured for detecting the plurality of periodic values of the average voltage V-ave and the corresponding plurality of periodic values of the peak voltage V-peak with the half-waveform pulsating direct power input P as being rectified from a full-waveform sinusoidal alternating power input P. In some examples [500] of the implementation of the system for determining periodic values of a phase angle Φ, the voltage detector [505] may be configured for detecting the plurality of periodic values of the average voltage V-ave and the corresponding plurality of periodic values of the peak voltage V-peak with the waveform power input P as being a universal line power input P having the peak voltage as being within a range of between about 85 volts (root mean squared "RMS") and about 320 volts RMS. In additional examples [500] of the implementation of the system for determining periodic values of a phase angle Φ, the voltage detector [505] may include a current sensor [515] for converting the waveform power input P into a voltage signal Vi. As examples, the current sensor [515] may include a series resistor or a Hall Effect sensor.

As an example [500] of the implementation of the system for determining periodic values of a phase angle Φ, the voltage detector [505] may include a circuit [605] as shown in FIG. 6. In the example of the circuit [605] shown in FIG. 6, a voltage input Vi to be detected may be received; a peak voltage may be output at V-peak; and an average voltage may be output at V-ave. In the example [500] of the system for determining periodic values of a phase angle Φ, the example of the circuit [605] may further include five resistors $R_1$, $R_2$, $R_3$, $R_4$ and $R_5$; two capacitors $C_1$, $C_2$; a path GND to ground; and a half-waveform pulsating direct power supply P.

In the examples [500] of the implementation of the system for determining periodic values of a phase angle Φ, the phase angle Φ detector [510] is in wired or wireless signal communication with the voltage detector [505], as represented by arrows [520], [525], for receiving the periodic V-peak voltage values and the periodic V-ave voltage values from the voltage detector [505]. In the examples [500] of the implementation of the system for determining periodic values of a phase angle Φ, the phase angle Φ detector [510] is configured for detecting a plurality of periodic values each being a ratio ("V-pa") of a one of the plurality of periodic values of the peak voltage V-peak divided by the corresponding one of the plurality of periodic values of the average voltage V-ave. Additionally in the examples [500] of the implementation of the system for determining periodic values of a phase angle Φ, the phase angle Φ detector [510] is configured for determining a plurality of periodic values of the phase angle Φ of the waveform power input each corresponding to a one of the plurality of periodic values of the ratio V-pa.

In some examples [500] of the implementation of the system for determining periodic values of a phase angle Φ, the phase angle Φ detector [510] may be configured for determining the plurality of periodic values of the phase angle Φ of the waveform power input P by pairing each one of the plurality of detected periodic values of the ratio V-pa with a closely-matching one of a plurality of calculated periodic values for the ratio V-pa being determined for a plurality of corresponding periodic values of the phase angle Φ according to the following formulas:

for periodic phase angles Φ being > 0 and < 90°,     Formula 3

$$V\text{-}pa = \frac{\pi(\sin\Phi)}{1-(\cos\Phi)}$$

for periodic phase angles Φ being > 90°,     Formula 4

$$V\text{-}pa = \frac{\pi}{1-(\cos\Phi)}$$

In additional examples [500] of the implementation of the system for determining periodic values of a phase angle Φ, the phase angle Φ detector [510] may be configured for pairing each one of the plurality of detected periodic values of the ratio V-pa with the closely-matching one of the plurality of calculated periodic values for the ratio V-pa by using a lookup table of the plurality of calculated periodic values for the ratio V-pa being determined for the plurality of corresponding periodic values of the phase angle Φ according to Formulas 3 and 4.

As an example [500] of the implementation of the system for determining periodic values of a phase angle Φ, the phase angle Φ detector [510] may be configured for pairing each one of the plurality of detected periodic values of the ratio V-pa with the closely-matching one of the plurality of calculated periodic values for the ratio V-pa by using the following Lookup Table III of a plurality of calculated periodic values for the ratio V-pa being determined for the plurality of corresponding periodic values of the phase angle Φ according to Formulas 3 and 4.

TABLE III

LOOKUP

| Phase Angle in Degrees | Sin Phi | Cos Phi | Ratio V-peak/V-ave |
|---|---|---|---|
| 0 | 0.00000000 | 1.00000000 | unquantified |
| 10 | 0.17364818 | 0.98480775 | 35.90856387 |
| 20 | 0.34202014 | 0.93969262 | 17.81685767 |
| 30 | 0.50000000 | 0.86602540 | 11.72458298 |
| 40 | 0.64278761 | 0.76604444 | 8.63145517 |
| 50 | 0.76604444 | 0.64278761 | 6.73716708 |
| 60 | 0.86602540 | 0.50000000 | 5.44139805 |
| 70 | 0.93969262 | 0.34202014 | 4.37006020 |
| 80 | 0.98480775 | 0.17364818 | 3.74122808 |
| 90 | 1.00000000 | 0.00000000 | 3.14159272 |
| 100 | 0.98480775 | −0.17364818 | 2.67677553 |
| 110 | 0.93969262 | −0.34202014 | 2.34094305 |
| 120 | 0.86602540 | −0.50000000 | 2.09439514 |
| 130 | 0.76604444 | −0.64278761 | 1.91235476 |
| 140 | 0.64278761 | −0.76604444 | 1.77888654 |
| 150 | 0.50000000 | −0.86602540 | 1.68357447 |
| 160 | 0.34202014 | −0.93969262 | 1.61963430 |
| 170 | 0.17364818 | −0.98480775 | 1.58281965 |
| 180 | 0.00000000 | −1.00000000 | 1.57079633 |

In this example [500] of the implementation of the system for determining periodic values of a phase angle Φ, Lookup Table III includes calculated periodic values for the ratio V-pa being determined according to Formulas 3 and 4 for corresponding periodic values of the phase angle Φ within a range of between zero radial degrees (0°) and 180° in periods each spanning 10°. Although a periodic value for the ratio V-pa may be unquantifiable according to Formulas 3 and 4 for a value of 0° of the phase angle Φ, a value for the ratio V-pa may be calculated for an arbitrarily determined minimum phase angle Φ; for example, the calculated value of the ratio V-pa for a phase angle Φ of 1° is about 360.

Further in this example [500] of the implementation of the system for determining periodic values of a phase angle Φ, the phase angle Φ detector [510] may pair each one of the plurality of detected periodic values of the ratio V-pa with a closely-matching one of the plurality of calculated periodic values for the ratio V-pa included in the Lookup Table III. Additionally in this example [500] of the implementation of the system for determining periodic values of a phase angle Φ, the phase angle Φ detector [510] may pair each one of the plurality of detected periodic values of the ratio V-pa with a most closely-matching one of the plurality of calculated periodic values for the ratio V-pa included in the Lookup Table III. As further examples [500] of the implementation of the system for determining periodic values of a phase angle Φ, another Lookup Table may be likewise generated as including calculated periodic values for the ratio V-pa being determined according to Formulas 3 and 4 for corresponding periodic values of the phase angle Φ spanning a range of between zero radial degrees 0° and 180° in periods each spanning a range of phase angles Φ much smaller than 10°. In additional examples [500] of the implementation of the system for determining periodic values of a phase angle Φ, so generating a Lookup Table as including calculated periodic values for the ratio V-pa being determined according to Formulas 3 and 4 for corresponding periodic values of the phase angle Φ spanning a range of between 0° and 180° in periods each being much smaller range than 10° may facilitate determining the periodic values of a phase angle Φ with accordingly increased accuracy.

As another example [500] of the implementation of the system for determining periodic values of a phase angle Φ, the phase angle Φ detector [510] may be configured for determining the plurality of periodic values of the phase angle Φ of the waveform power input P by: iteratively determining a plurality of calculated periodic values for the ratio V-pa according to the following Formulas 3 and 4 for a plurality of corresponding periodic values of the phase angle Φ; and pairing each one of the plurality of detected periodic values of the ratio V-pa with a closely-matching one of the plurality of calculated periodic values for the ratio V-pa:

$$V\text{-}pa = \frac{\pi(\text{sine } \Phi)}{1 - (\text{cosine } \Phi)} \quad \text{for periodic phase angles } \Phi \text{ being} > 0 \text{ and} < 90°, \quad \text{Formula 3}$$

$$V\text{-}pa = \frac{\pi}{1 - (\text{cosine } \Phi)} \quad \text{for periodic phase angles } \Phi \text{ being} > 90°, \quad \text{Formula 4}$$

Figure 7:
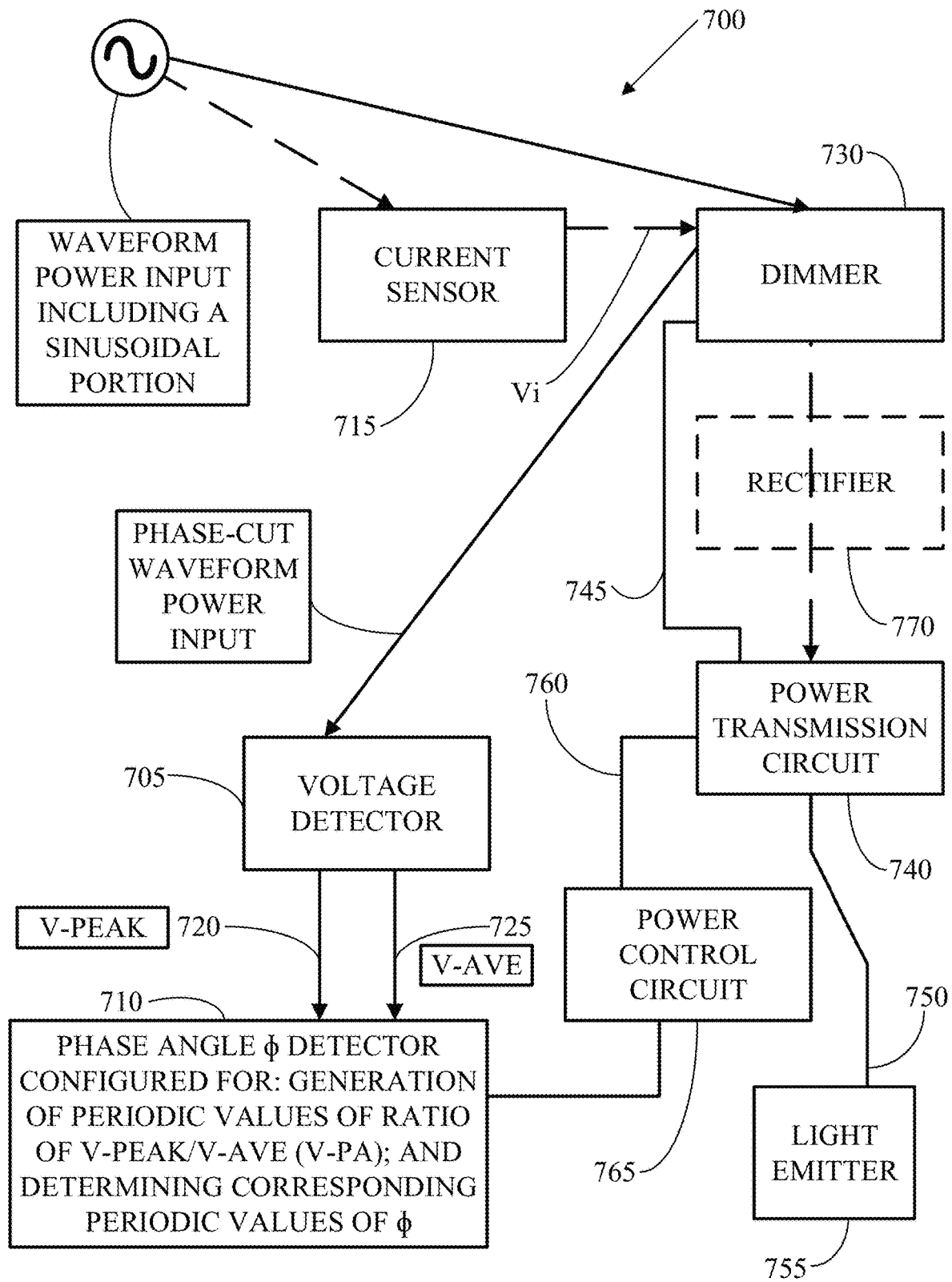
FIG. 7 is a block diagram showing an example [700] of an implementation of a lighting system.
Figure 8:
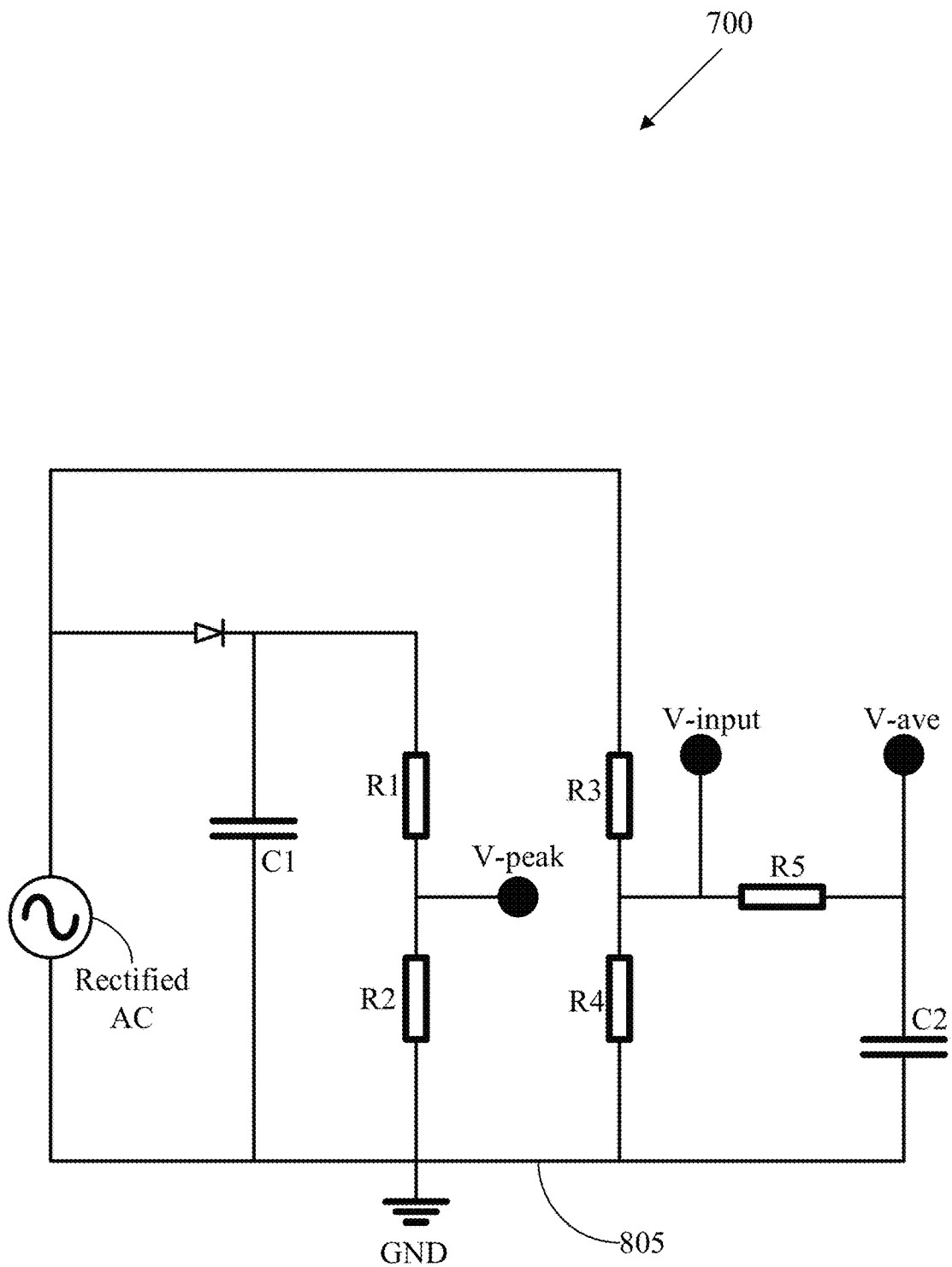
FIG. 8 is a schematic diagram of an example [805] of a circuit that may be included in the example [700] of the lighting system.

FIG. 7 is a block diagram showing an example [700] of an implementation of a lighting system. FIG. 8 is a schematic diagram of an example [805] of a circuit that may be included in the example [700] of the lighting system. It is understood throughout this specification that an example [700] of a system may include any combination of the features that are discussed herein in connection with the examples [100], [300], [500], [700] of systems. Accordingly, the entireties of the discussions herein of the other examples [100], [300], [500] of systems are hereby incorporated in this discussion of the examples [700] of the systems.

As shown in FIG. 7, the example [700] of the implementation of the lighting system includes a dimmer [730] being configured for performing a phase-cutting operation on a waveform power input P. The example [700] of the implementation of the lighting system also includes a power transmission circuit [740] being in electrical communication as represented by an arrow [745] with the dimmer [730] and is configured for being placed in electrical communication as represented by an arrow [750] with a light emitter [755]. In some examples, the example [700] of the lighting system may include the light emitter [755]. In further examples of the example [700] of the lighting system, the power transmission circuit [740] may include a switched mode power supply, a resonant converter, or a linear regulator. In the example [700] of the implementation of the lighting system, the power transmission circuit [740] is configured for receiving a wired or wireless power control signal represented by an arrow [760] for controlled transmission of the waveform power input P to the light emitter [755]. The example [700] of the implementation of the lighting system additionally includes a voltage detector [705] and a phase angle Φ detector [710]. In the example [700] of the lighting system, the voltage detector [705] is configured for detecting a plurality of periodic values of an average voltage ("V-ave") of the waveform power input P and for detecting a corresponding plurality of periodic values of a peak voltage ("V-peak") of the waveform power input P.

In some examples [700] of the implementation of the lighting system, the voltage detector [705] may be configured for detecting the plurality of periodic values of the average voltage V-ave and the corresponding plurality of periodic values of the peak voltage V-peak with the waveform power input P as being a phase-cut waveform power input P.

In examples [700] of the implementation of the lighting system, the dimmer [730] may be configured for performing either a leading edge phase cut operation or a trailing edge phase cut operation on the waveform power input P; and the voltage detector [705] may be configured for detecting the plurality of periodic values of the average voltage V-ave and the corresponding plurality of periodic values of the peak voltage V-peak with the waveform power input P as respectively being either a leading edge phase-cut waveform power input or a trailing edge phase-cut waveform power input P. In further examples [700] of the implementation of the lighting system, the dimmer [730] may include: a TRIAC; a silicon-controlled rectifier (SCR); a MOSFET; or an insulated gate bipolar transistor (IGBT).

In further examples [700] of the implementation of the lighting system, the voltage detector [705] may be configured for detecting the plurality of periodic values of the average voltage V-ave and the corresponding plurality of periodic values of the peak voltage V-peak with the waveform power input P as being a half-waveform pulsating direct power input P. In other examples [700] of the implementation of the lighting system, the voltage detector [705] may be configured for detecting the plurality of periodic values of the average voltage V-ave and the corresponding plurality of periodic values of the peak voltage V-peak with the half-waveform pulsating direct power input P as being rectified from a full-waveform sinusoidal alternating power input P. In some examples, the example [700] of the implementation of the lighting system may include a full-wave rectifier [770] being in electrical communication with the dimmer [730] and the power transmission circuit [740].

In some examples [700] of the implementation of the lighting system, the voltage detector [705] may be configured for detecting the plurality of periodic values of the average voltage V-ave and the corresponding plurality of periodic values of the peak voltage V-peak with the waveform power input P as being a universal line power input P having the peak voltage as being within a range of between about 85 volts (root mean squared "RMS") and about 320 volts RMS. In additional examples [700] of the implementation of the lighting system, the voltage detector [705] may include a current sensor [715] for converting the waveform power input P into a voltage signal Vi. As examples, the current sensor [715] may include a series resistor or a Hall Effect sensor.

As an example [700] of the implementation of the lighting system, the voltage detector [705] may include a circuit [805] as shown in FIG. 8. In the example of the circuit [805] shown in FIG. 8, a voltage input Vi to be detected may be received; a peak voltage may be output at V-peak; and an average voltage may be output at V-ave. In the example

[700] of the lighting system, the example of the circuit [805] may further include five resistors $R_1$, $R_2$, $R_3$, $R_4$ and $R_5$; two capacitors $C_1$, $C_2$; a path GND to ground; and a half-waveform pulsating direct power supply P.

In the examples [700] of the implementation of the lighting system, the phase angle Φ detector [710] is in wired or wireless signal communication with the voltage detector [705], as represented by arrows [720], [725], for receiving the periodic V-peak voltage values and the periodic V-ave voltage values from the voltage detector [705]. In the examples [700] of the implementation of the lighting system, the phase angle Φ detector [710] is configured for detecting a plurality of periodic values each being a ratio ("V-pa") of a one of the plurality of periodic values of the peak voltage V-peak divided by the corresponding one of the plurality of periodic values of the average voltage V-ave. Additionally in the examples [700] of the implementation of the lighting system, the phase angle Φ detector [710] is configured for determining a plurality of periodic values of the phase angle Φ of the waveform power input each corresponding to a one of the plurality of periodic values of the ratio V-pa.

The examples [700] of the implementation of the lighting system additionally include a power control circuit [765], being configured for utilizing the plurality of periodic values of the phase angle Φ of the waveform power input P in generating the power control signal [760]. In the examples [700] of the implementation of the lighting system, the power control circuit [765] is configured for sending the power control signal [760] to the power transmission circuit [740]. In some examples [700] of the implementation of the lighting system, the power control circuit [765] may be in wired or wireless control signal communication as represented by the arrow [760] for sending the power control signal [760] to the power transmission circuit [740].

In some examples [700] of the implementation of the system for determining periodic values of a phase angle Φ, the phase angle Φ detector [710] may be configured for determining the plurality of periodic values of the phase angle Φ of the waveform power input P by pairing each one of the plurality of detected periodic values of the ratio V-pa with a closely-matching one of a plurality of calculated periodic values for the ratio V-pa being determined for a plurality of corresponding periodic values of the phase angle Φ according to the following formulas:

for periodic phase angles Φ being > 0 and < 90°,     Formula 3

$$V\text{-}pa = \frac{\pi(\sine \Phi)}{1 - (\cosine \Phi)}$$

for periodic phase angles Φ being > 90°,     Formula 4

$$V\text{-}pa = \frac{\pi}{1 - (\cosine \Phi)}$$

In additional examples [700] of the implementation of the system for determining periodic values of a phase angle Φ, the phase angle Φ detector [710] may be configured for pairing each one of the plurality of detected periodic values of the ratio V-pa with the closely-matching one of the plurality of calculated periodic values for the ratio V-pa by using a lookup table of the plurality of calculated periodic values for the ratio V-pa being determined for the plurality of corresponding periodic values of the phase angle Φ according to Formulas 3 and 4.

As an example [700] of the implementation of the system for determining periodic values of a phase angle Φ, the phase angle Φ detector [710] may be configured for pairing each one of the plurality of detected periodic values of the ratio V-pa with the closely-matching one of the plurality of calculated periodic values for the ratio V-pa by using the following Lookup Table IV of a plurality of calculated periodic values for the ratio V-pa being determined for the plurality of corresponding periodic values of the phase angle Φ according to Formulas 3 and 4.

TABLE IV

LOOKUP

| Phase Angle in Degrees | Sin Phi | Cos Phi | Ratio V-peak/V-ave |
|---|---|---|---|
| 0 | 0.00000000 | 1.00000000 | unquantified |
| 10 | 0.17364818 | 0.98480775 | 35.90856387 |
| 20 | 0.34202014 | 0.93969262 | 17.81685767 |
| 30 | 0.50000000 | 0.86602540 | 11.72458298 |
| 40 | 0.64278761 | 0.76604444 | 8.63145517 |
| 50 | 0.76604444 | 0.64278761 | 6.73716708 |
| 60 | 0.86602540 | 0.50000000 | 5.44139805 |
| 70 | 0.93969262 | 0.34202014 | 4.37006020 |
| 80 | 0.98480775 | 0.17364818 | 3.74122808 |
| 90 | 1.00000000 | 0.00000000 | 3.14159272 |
| 100 | 0.98480775 | −0.17364818 | 2.67677553 |
| 110 | 0.93969262 | −0.34202014 | 2.34094305 |
| 120 | 0.86602540 | −0.50000000 | 2.09439514 |
| 130 | 0.76604444 | −0.64278761 | 1.91235476 |
| 140 | 0.64278761 | −0.76604444 | 1.77888654 |
| 150 | 0.50000000 | −0.86602540 | 1.68357447 |
| 160 | 0.34202014 | −0.93969262 | 1.61963430 |
| 170 | 0.17364818 | −0.98480775 | 1.58281965 |
| 180 | 0.00000000 | −1.00000000 | 1.57079633 |

In this example [700] of the implementation of the system for determining periodic values of a phase angle Φ, Lookup Table IV includes calculated periodic values for the ratio V-pa being determined according to Formulas 3 and 4 for corresponding periodic values of the phase angle Φ within a range of between zero radial degrees (0°) and 180° in periods each spanning 10°. Although a periodic value for the ratio V-pa may be unquantifiable according to Formulas 3 and 4 for a value of 0° of the phase angle Φ, a value for the ratio V-pa may be calculated for an arbitrarily determined minimum phase angle Φ; for example, the calculated value of the ratio V-pa for a phase angle Φ of 1° is about 360. Further in this example [700] of the implementation of the system for determining periodic values of a phase angle Φ, the phase angle Φ detector [710] may pair each one of the plurality of detected periodic values of the ratio V-pa with a closely-matching one of the plurality of calculated periodic values for the ratio V-pa included in the Lookup Table IV. Additionally in this example [700] of the implementation of the system for determining periodic values of a phase angle Φ, the phase angle Φ detector [710] may pair each one of the plurality of detected periodic values of the ratio V-pa with a most closely-matching one of the plurality of calculated periodic values for the ratio V-pa included in the Lookup Table IV. As further examples [700] of the implementation of the system for determining periodic values of a phase angle Φ, another Lookup Table may be likewise generated as including calculated periodic values for the ratio V-pa being determined according to Formulas 3 and 4 for corresponding periodic values of the phase angle Φ spanning a range of between zero radial degrees 0° and 180° in periods each spanning a range of phase angles Φ much smaller than 10°. In additional examples [700] of the implementation of the system for determining periodic values of a phase angle Φ, so generating a Lookup Table as including calculated periodic values for the ratio V-pa being determined according to Formulas 3 and 4 for corresponding periodic values of the phase angle Φ spanning a range of between 0° and 180° in periods each being much smaller range than 10° may facilitate determining the periodic values of a phase angle Φ with accordingly increased accuracy.

As another example [700] of the implementation of the system for determining periodic values of a phase angle Φ, the phase angle Φ detector [710] may be configured for determining the plurality of periodic values of the phase angle Φ of the waveform power input P by: iteratively determining a plurality of calculated periodic values for the ratio V-pa according to the following Formulas 3 and 4 for a plurality of corresponding periodic values of the phase angle Φ; and pairing each one of the plurality of detected periodic values of the ratio V-pa with a closely-matching one of the plurality of calculated periodic values for the ratio V-pa:

for periodic phase angles Φ being > 0 and < 90°, Formula 3
$$V\text{-}pa = \frac{\pi(\text{sine } \Phi)}{1 - (\text{cosine } \Phi)}$$

for periodic phase angles Φ being > 90°, Formula 4
$$V\text{-}pa = \frac{\pi}{1 - (\text{cosine } \Phi)}$$

Figure 9:
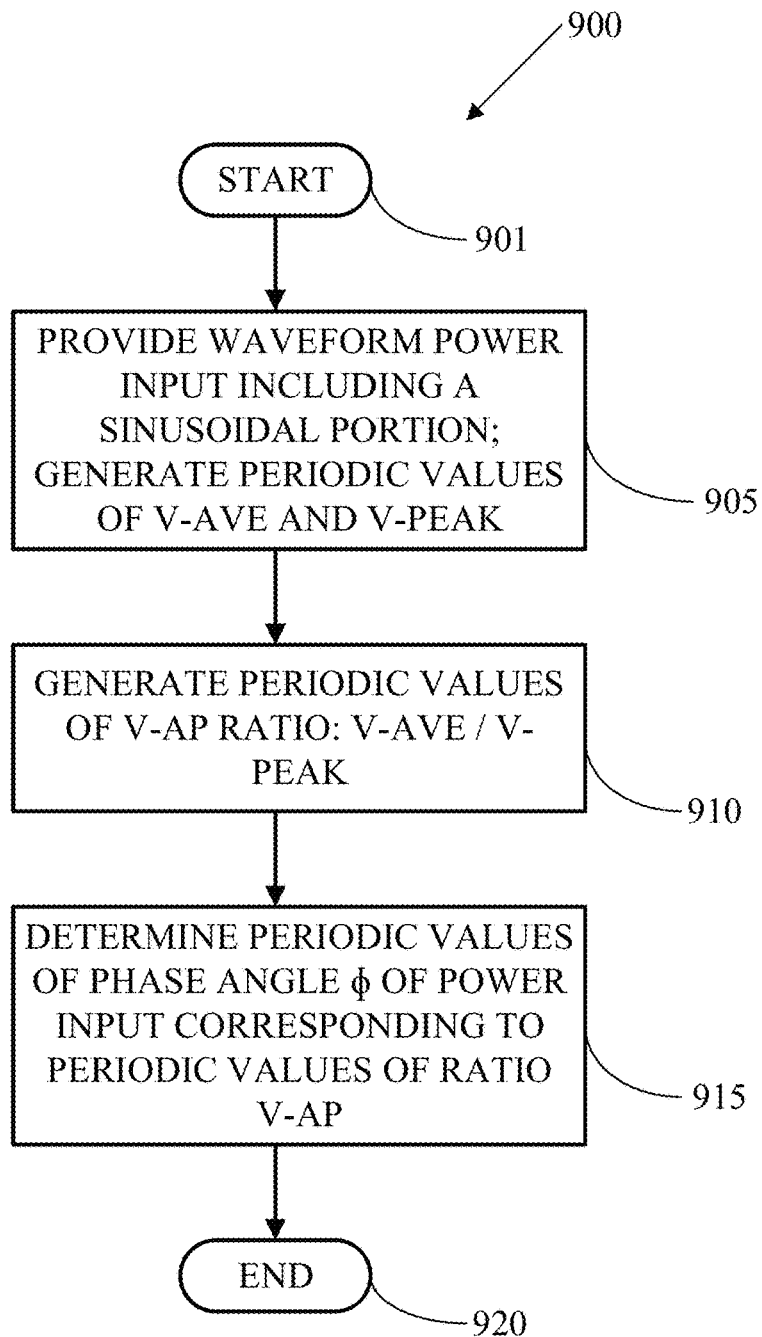
FIG. 9 is a flow-chart of an example [900] of a process for determining periodic values of a phase angle Φ of a waveform power input.

FIG. 9 is a flow-chart of an example [900] of a process for determining periodic values of a phase angle Φ of a waveform power input.

It is understood throughout this specification that an example [900] of a process may include any combination of the features that are discussed herein in connection with the examples [900], [1000], [1100], [1200] of processes. Accordingly, the entireties of the discussions herein of the other examples [1000], [1100], [1200] of processes are hereby incorporated in this discussion of the examples [900] of the processes.

The example [900] of the process starts at step [901]. Step [905] of the example [900] of the process includes: providing a waveform power input; and detecting a plurality of periodic values of an average voltage ("V-ave") of the waveform power input; and detecting a corresponding plurality of periodic values of a peak voltage ("V-peak") of the waveform power input. At step [910] of the example [900] of the process, a plurality of periodic values are detected, each being a ratio ("V-ap") of a one of the plurality of periodic values of the average voltage V-ave divided by the corresponding one of the plurality of periodic values of the peak voltage V-peak. Step [915] of the example [900] of the process includes determining a plurality of periodic values of the phase angle Φ of the waveform power input each corresponding to a one of the plurality of periodic values of the ratio V-ap. The example [900] of the process may then end at step [920].

In some examples [900] of the process, providing the waveform power input at step [905] may include providing the waveform power input as being a phase-cut waveform power input. In further examples [900] of the process, providing the waveform power input at step [905] may include providing the waveform power input as being a leading edge phase-cut waveform power input or a trailing edge phase-cut waveform power input. In additional examples [900] of the process, providing the waveform power input at step [905] may include providing the waveform power input as being a half-waveform pulsating direct power input. In other examples [900] of the process, providing the waveform power input at step [905] may include providing the half-waveform pulsating direct power input as being rectified from a full-waveform sinusoidal alternating power input. In some examples [900] of the process, providing the waveform power input at step [905] may include providing the waveform power input as being a universal line power input having the peak voltage as being within a range of between about 85 volts (root mean squared "RMS") and about 320 volts RMS.

In some examples [900] of the process, determining the plurality of periodic values of the phase angle Φ of the waveform power input at step [915] may include pairing each one of the plurality of detected periodic values of the ratio V-ap with a closely-matching one of a plurality of calculated periodic values for the ratio V-ap being determined for a plurality of corresponding periodic values of the phase angle Φ according to the following formulas:

for periodic phase angles Φ being < 90°, Formula 1
$$V\text{-}ap = \frac{1 - (\text{cosine } \Phi)}{\pi(\text{sine } \Phi)}$$

for periodic phase angles Φ being ≥ 90°, Formula 2
$$V\text{-}ap = \frac{1 - (\text{cosine } \Phi)}{\pi}$$

In further examples [900] of the process, determining the plurality of periodic values of the phase angle Φ of the waveform power input at step [915] may include pairing each one of the plurality of detected periodic values of the ratio V-ap with the closely-matching one of the plurality of calculated periodic values for the ratio V-ap includes using a lookup table of the plurality of calculated periodic values for the ratio V-ap being determined for the plurality of corresponding periodic values of the phase angle Φ according to Formulas 1 and 2.

In additional examples [900] of the process, determining the plurality of periodic values of the phase angle Φ of the waveform power input at step [915] may include: iteratively determining a plurality of calculated periodic values for the ratio V-ap according to the following Formulas 1 and 2 for a plurality of corresponding periodic values of the phase angle t; and pairing each one of the plurality of detected periodic values of the ratio V-ap with a closely-matching one of the plurality of calculated periodic values for the ratio V-ap:

for periodic phase angles Φ being < 90°, Formula 1
$$V\text{-}ap = \frac{1 - (\text{cosine } \Phi)}{\pi(\text{sine } \Phi)}$$

for periodic phase angles Φ being ≥ 90°, Formula 2
$$V\text{-}ap = \frac{1 - (\text{cosine } \Phi)}{\pi}$$

Figure 10:
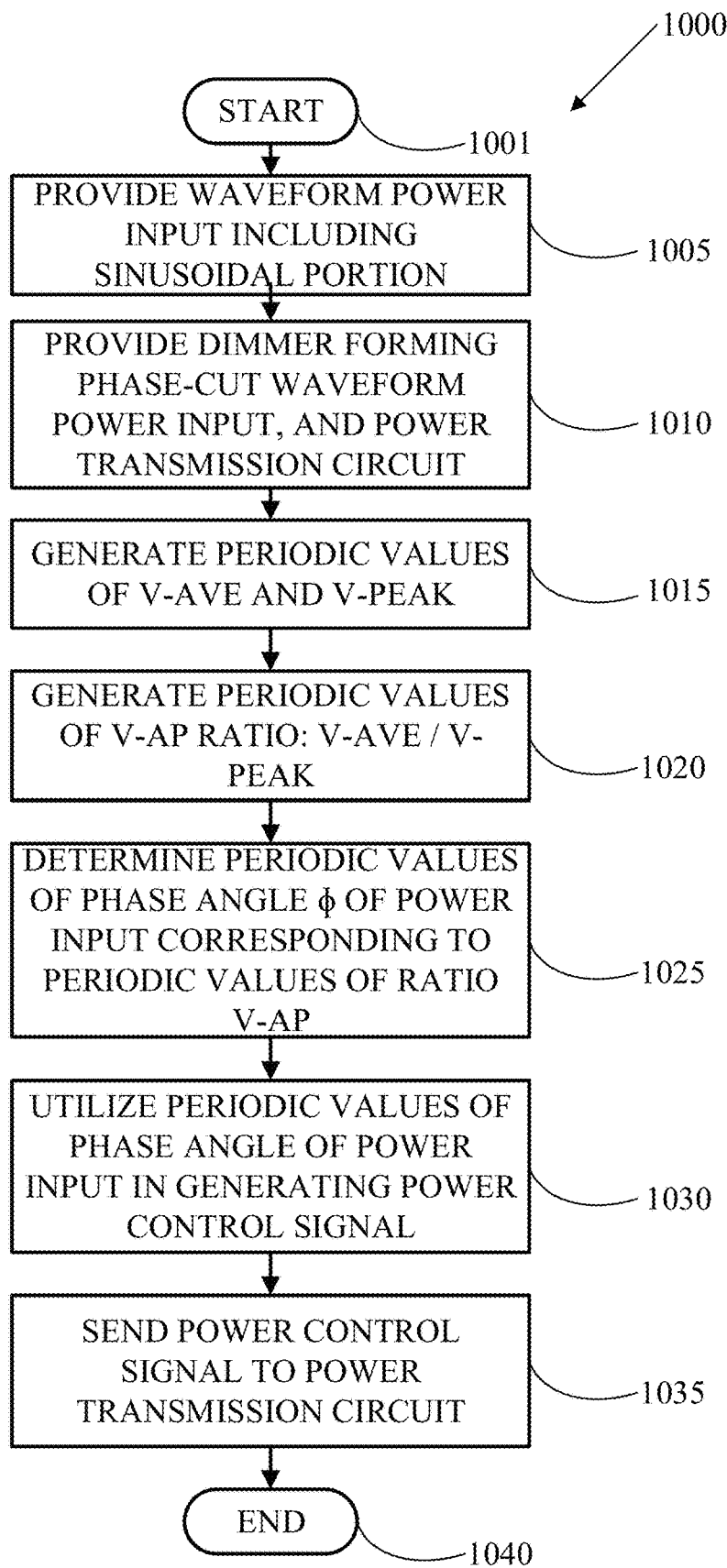
FIG. 10 is a flow-chart of an example [1000] of a lighting process.

FIG. 10 is a flow-chart of an example [1000] of a lighting process. The example [1000] of the process starts at step [1001]. It is understood throughout this specification that an example [1000] of a process may include any combination of the features that are discussed herein in connection with the examples [900], [1000], [1100], [1200] of processes. Accordingly, the entireties of the discussions herein of the other examples [900], [1100], [1200] of processes are hereby incorporated in this discussion of the examples [1000] of the processes.

Step [1005] of the example [1000] of the process includes providing a waveform power input. Step [1010] of the example [1000] of the process includes: providing a dimmer being configured for performing a phase-cutting operation on the waveform power input; and providing a power transmission circuit being in electrical communication with the dimmer and with a light emitter, the power transmission circuit being configured for receiving a power control signal for controlled transmission of the waveform power input to the light emitter. At step [1015] of the example [1000] of the process, a plurality of periodic values of an average voltage ("V-ave") of the waveform power input are detected; and a corresponding plurality of periodic values of a peak voltage ("V-peak") of the waveform power input are detected. Step [1020] of the example [1000] of the process includes detecting a plurality of periodic values each being a ratio ("V-ap") of a one of the plurality of periodic values of the average voltage V-ave divided by the corresponding one of the plurality of periodic values of the peak voltage V-peak. At step [1025] of the example [1000] of the process, a plurality of periodic values of the phase angle Φ of the waveform power input are determined, each corresponding to a one of the plurality of periodic values of the ratio V-ap. Step [1030] of the example [1000] of the process includes utilizing the plurality of periodic values of the phase angle Φ of the waveform power input in generating the power control signal. At step [1035] of the example [1000] of the process, the power control signal is sent to the power transmission circuit. The example [1000] of the process may then end at step [1040].

In some examples of the example [1000] of the process, providing the waveform power input at step [1005] may include providing the waveform power input as being a phase-cut waveform power input. In further examples of the example [1000] of the process, providing the dimmer at step [1010] may include providing the dimmer as being configured for performing either a leading edge phase cut operation or a trailing edge phase cut operation on the waveform power input; and providing the waveform power input at step [1005] may include providing the waveform power input as respectively being either a leading edge phase-cut waveform power input or a trailing edge phase-cut waveform power input. In additional examples of the example [1000] of the process, providing the waveform power input at step [1005] may include providing the waveform power input as being a half-waveform pulsating direct power input. In other examples of the example [1000] of the process, providing the waveform power input at step [1005] may include providing a half-waveform pulsating direct power input as being rectified from a full-waveform sinusoidal alternating power input. In some examples of the example [1000] of the process, providing the waveform power input may include providing the waveform power input as being a universal line power input having the peak voltage as being within a range of between about 85 volts (root mean squared "RMS") and about 320 volts RMS.

In some examples of the example [1000] of the process, determining the plurality of periodic values of the phase angle Φ of the waveform power input at step [1025] may include pairing each one of the plurality of detected periodic values of the ratio V-ap with a closely-matching one of a plurality of calculated periodic values for the ratio V-ap being determined for a plurality of corresponding periodic values of the phase angle Φ according to the following formulas:

for periodic phase angles Φ being < 90°, Formula 1
$$V\text{-}ap = \frac{1 - (\text{cosine }\Phi)}{\pi(\text{sine }\Phi)}$$

for periodic phase angles Φ being ≥ 90°, Formula 2
$$V\text{-}ap = \frac{1 - (\text{cosine }\Phi)}{\pi}$$

In some examples of the example [1000] of the process, determining the plurality of periodic values of the phase angle Φ of the waveform power input at step [1025] may include pairing each one of the plurality of detected periodic values of the ratio V-ap with the closely-matching one of the plurality of calculated periodic values for the ratio V-ap by using a lookup table of the plurality of calculated periodic values for the ratio V-ap being determined for the plurality of corresponding periodic values of the phase angle Φ according to Formulas 1 and 2.

In additional examples of the example [1000] of the process, determining the plurality of periodic values of the phase angle Φ of the waveform power input at step [1025] may include: iteratively determining a plurality of calculated periodic values for the ratio V-ap according to the following Formulas 1 and 2 for a plurality of corresponding periodic values of the phase angle Φ; and pairing each one of the plurality of detected periodic values of the ratio V-ap with a closely-matching one of the plurality of calculated periodic values for the ratio V-ap:

for periodic phase angles Φ being < 90°, Formula 1
$$V\text{-}ap = \frac{1 - (\text{cosine }\Phi)}{\pi(\text{sine }\Phi)}$$

for periodic phase angles Φ being ≥ 90°, Formula 2
$$V\text{-}ap = \frac{1 - (\text{cosine }\Phi)}{\pi}$$

Figure 11:
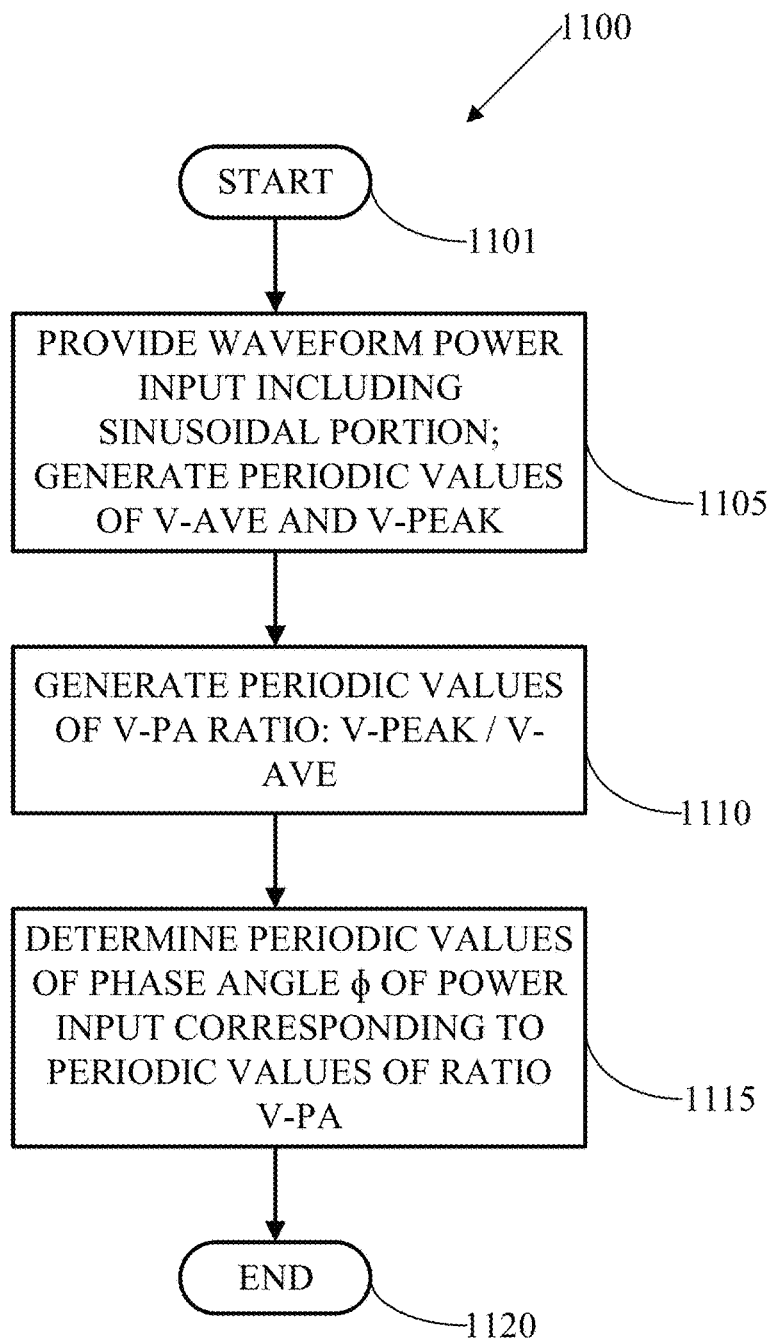
FIG. 11 is a flow-chart of an example [1100] of a process for determining periodic values of a phase angle Φ of a waveform power input.

FIG. 11 is a flow-chart of an example [1100] of a process for determining periodic values of a phase angle Φ of a waveform power input. It is understood throughout this specification that an example [1100] of a process may include any combination of the features that are discussed herein in connection with the examples [900], [1000], [1100], [1200] of processes. Accordingly, the entireties of the discussions herein of the other examples [900], [1000], [1200] of processes are hereby incorporated in this discussion of the examples [1100] of the processes.

The example [1100] of the process starts at step [1101]. Step [1105] of the example [1100] of the process includes: providing a waveform power input; and detecting a plurality of periodic values of an average voltage ("V-ave") of the waveform power input; and detecting a corresponding plurality of periodic values of a peak voltage ("V-peak") of the waveform power input. At step [1110] of the example [1100] of the process, a plurality of periodic values are detected, each being a ratio ("V-pa") of a one of the plurality of periodic values of the peak voltage V-peak divided by the corresponding one of the plurality of periodic values of the average voltage V-ave. Step [1115] of the example [1100] of the process includes determining a plurality of periodic values of the phase angle Φ of the waveform power input each corresponding to a one of the plurality of periodic values of the ratio V-pa. The example [1100] of the process may then end at step [1120].

In some examples [1100] of the process, providing the waveform power input at step [1105] may include providing the waveform power input as being a phase-cut waveform power input. In further examples [1100] of the process, providing the waveform power input at step [1105] may include providing the waveform power input as being a leading edge phase-cut waveform power input or a trailing edge phase-cut waveform power input. In additional examples [1100] of the process, providing the waveform power input at step [1105] may include providing the waveform power input as being a half-waveform pulsating direct power input. In other examples [1100] of the process, providing the waveform power input at step [1105] may include providing the half-waveform pulsating direct power input as being rectified from a full-waveform sinusoidal alternating power input. In some examples [1100] of the process, providing the waveform power input at step [1105] may include providing the waveform power input as being a universal line power input having the peak voltage as being within a range of between about 85 volts (root mean squared "RMS") and about 320 volts RMS.

In some examples [1100] of the process, determining the plurality of periodic values of the phase angle Φ of the waveform power input at step [1115] may include pairing each one of the plurality of detected periodic values of the ratio V-pa with a closely-matching one of a plurality of calculated periodic values for the ratio V-pa being determined for a plurality of corresponding periodic values of the phase angle Φ according to the following formulas:

for periodic phase angles Φ being > 0 and < 90°, Formula 3

$$V\text{-}pa = \frac{\pi(\sine \Phi)}{1 - (\cosine \Phi)}$$

for periodic phase angles Φ being > 90°, Formula 4

$$V\text{-}pa = \frac{\pi}{1 - (\cosine \Phi)}$$

In further examples [1100] of the process, determining the plurality of periodic values of the phase angle Φ of the waveform power input at step [1115] may include pairing each one of the plurality of detected periodic values of the ratio V-pa with the closely-matching one of the plurality of calculated periodic values for the ratio V-pa includes using a lookup table of the plurality of calculated periodic values for the ratio V-pa being determined for the plurality of corresponding periodic values of the phase angle Φ according to Formulas 3 and 4.

In additional examples [1100] of the process, determining the plurality of periodic values of the phase angle Φ of the waveform power input at step [1115] may include: iteratively determining a plurality of calculated periodic values for the ratio V-pa according to the following Formulas 3 and 4 for a plurality of corresponding periodic values of the phase angle t; and pairing each one of the plurality of detected periodic values of the ratio V-pa with a closely-matching one of the plurality of calculated periodic values for the ratio V-pa:

for periodic phase angles Φ being > 0 and < 90°, Formula 3

$$V\text{-}pa = \frac{\pi(\sine \Phi)}{1 - (\cosine \Phi)}$$

-continued for periodic phase angles Φ being > 90°, Formula 4

$$V\text{-}pa = \frac{\pi}{1 - (\cosine \Phi)}$$

Figure 12:
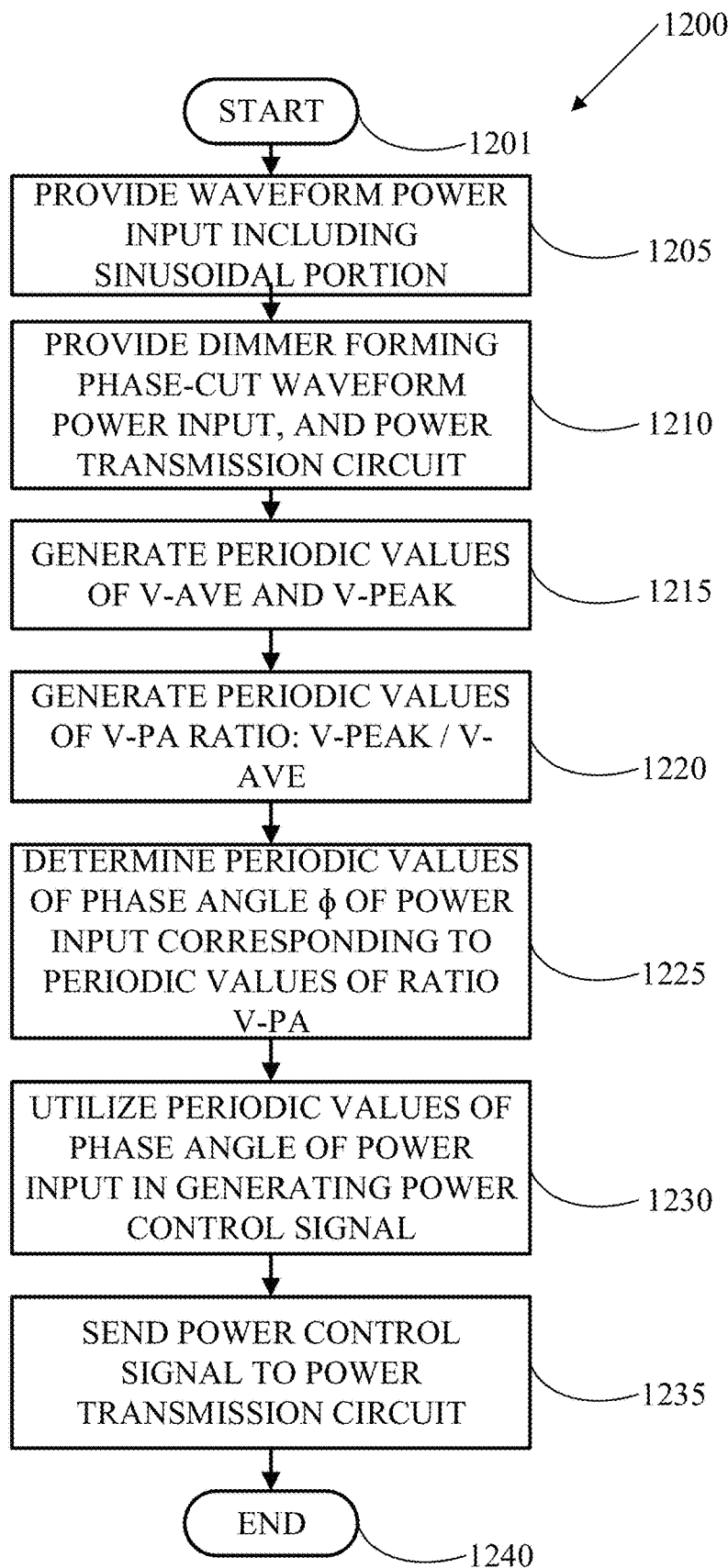
FIG. 12 is a flow-chart of an example [1200] of a lighting process.

FIG. 12 is a flow-chart of an example [1200] of a lighting process. The example [1200] of the process starts at step [1201]. It is understood throughout this specification that an example [1200] of a process may include any combination of the features that are discussed herein in connection with the examples [900], [1000], [1100], [1200] of processes. Accordingly, the entireties of the discussions herein of the other examples [900], [1000], [1100] of processes are hereby incorporated in this discussion of the examples [1200] of the processes.

Step [1205] of the example [1200] of the process includes providing a waveform power input. Step [1210] of the example [1200] of the process includes: providing a dimmer being configured for performing a phase-cutting operation on the waveform power input; and providing a power transmission circuit being in electrical communication with the dimmer and with a light emitter, the power transmission circuit being configured for receiving a power control signal for controlled transmission of the waveform power input to the light emitter. At step [1215] of the example [1200] of the process, a plurality of periodic values of an average voltage ("V-ave") of the waveform power input are detected; and a corresponding plurality of periodic values of a peak voltage ("V-peak") of the waveform power input are detected. Step [1220] of the example [1200] of the process includes detecting a plurality of periodic values each being a ratio ("V-pa") of a one of the plurality of periodic values of the peak voltage V-peak divided by the corresponding one of the plurality of periodic values of the average voltage V-ave.

At step [1225] of the example [1200] of the process, a plurality of periodic values of the phase angle Φ of the waveform power input are determined, each corresponding to a one of the plurality of periodic values of the ratio V-pa. Step [1230] of the example [1200] of the process includes utilizing the plurality of periodic values of the phase angle Φ of the waveform power input in generating the power control signal. At step [1235] of the example [1200] of the process, the power control signal is sent to the power transmission circuit. The example [1200] of the process may then end at step [1240].

In some examples of the example [1200] of the process, providing the waveform power input at step [1205] may include providing the waveform power input as being a phase-cut waveform power input. In further examples of the example [1200] of the process, providing the dimmer at step [1210] may include providing the dimmer as being configured for performing either a leading edge phase cut operation or a trailing edge phase cut operation on the waveform power input; and providing the waveform power input at step [1205] may include providing the waveform power input as respectively being either a leading edge phase-cut waveform power input or a trailing edge phase-cut waveform power input. In additional examples of the example [1200] of the process, providing the waveform power input at step [1205] may include providing the waveform power input as being a half-waveform pulsating direct power input. In other examples of the example [1200] of the process, providing the waveform power input at step [1205] may include providing a half-waveform pulsating direct power input as being rectified from a full-waveform sinusoidal alternating power input. In some examples of the example

[1200] of the process, providing the waveform power input may include providing the waveform power input as being a universal line power input having the peak voltage as being within a range of between about 85 volts (root mean squared "RMS") and about 320 volts RMS.

In some examples of the example [1200] of the process, determining the plurality of periodic values of the phase angle Φ of the waveform power input at step [1225] may include pairing each one of the plurality of detected periodic values of the ratio V-pa with a closely-matching one of a plurality of calculated periodic values for the ratio V-pa being determined for a plurality of corresponding periodic values of the phase angle Φ according to the following formulas:

for periodic phase angles Φ being > 0 and < 90°,   Formula 3
$$V\text{-}pa = \frac{\pi(\sine \Phi)}{1 - (\cosine \Phi)}$$

for periodic phase angles Φ being > 90°,   Formula 4
$$V\text{-}pa = \frac{\pi}{1 - (\cosine \Phi)}$$

In some examples of the example [1200] of the process, determining the plurality of periodic values of the phase angle Φ of the waveform power input at step [1225] may include pairing each one of the plurality of detected periodic values of the ratio V-pa with the closely-matching one of the plurality of calculated periodic values for the ratio V-pa by using a lookup table of the plurality of calculated periodic values for the ratio V-pa being determined for the plurality of corresponding periodic values of the phase angle Φ according to Formulas 3 and 4.

In additional examples of the example [1200] of the process, determining the plurality of periodic values of the phase angle Φ of the waveform power input at step [1225] may include: iteratively determining a plurality of calculated periodic values for the ratio V-pa according to the following Formulas 3 and 4 for a plurality of corresponding periodic values of the phase angle Φ; and pairing each one of the plurality of detected periodic values of the ratio V-pa with a closely-matching one of the plurality of calculated periodic values for the ratio V-pa:

for periodic phase angles Φ being > 0 and < 90°,   Formula 3
$$V\text{-}pa = \frac{\pi(\sine \Phi)}{1 - (\cosine \Phi)}$$

for periodic phase angles Φ being > 90°,   Formula 4
$$V\text{-}pa = \frac{\pi}{1 - (\cosine \Phi)}$$

The examples [100], [300], [500], [700] of systems and the examples [900], [1000], [1100], [1200] of processes may generally be utilized in end-use applications for lighting systems that utilize a phase-cut waveform power input. The examples of lighting systems and processes that are disclosed herein may also be fabricated and utilized together with the teachings disclosed in the following commonly-owned U.S. patent application, the entirety of which is hereby incorporated herein by reference: U.S. patent application Ser. No. 14/526,504 filed on Oct. 28, 2014, entitled "Lighting Systems Having Multiple Light Sources".

While the present invention has been disclosed in a presently defined context, it will be recognized that the present teachings may be adapted to a variety of contexts consistent with this disclosure and the claims that follow. For example, the lighting systems shown in the figures and discussed above can be adapted in the spirit of the many optional parameters described.

I claim:

1. A system for determining periodic values of a phase angle (Φ) of a waveform power input, comprising:
a voltage detector for receiving a waveform power input including a sinusoidal portion, the voltage detector being configured for generating a plurality of periodic values of an average voltage ("V-ave") of the waveform power input and for generating a corresponding plurality of periodic values of a peak voltage "(V-peak)" of the waveform power input;
a phase angle (Φ) detector being in signal communication for receiving the periodic values of the average voltage (V-ave) and the peak voltage (V-peak) from the voltage detector and being configured for: generating a plurality of periodic values each being a ratio ("V-ap") of Hall one of the plurality of periodic values of the average voltage (V-ave) divided by the corresponding one of the plurality of periodic values of the peak voltage (V-peak); and determining a plurality of periodic values of a phase angle (Φ) of the waveform power input each corresponding to one of the plurality of periodic values of the ratio (V-ap);
a power transmission circuit being configured for being placed in electrical communication with a light emitter, the power transmission circuit being configured for receiving a power control signal for controlled transmission of the waveform power input to the light emitter; and
a power control circuit being configured to: for utilizing the plurality of periodic values of the phase angle (Φ) of the waveform power input in generating the power control signal; and for sending the power control signal to the power transmission circuit.

2. The system of claim 1, wherein the voltage detector is configured for generating the plurality of periodic values of the average voltage (V-ave) and the corresponding plurality of periodic values of the peak voltage (V-peak) with the waveform power input as being a phase-cut waveform power input.

3. The system of claim 2, wherein the voltage detector is configured for generating the plurality of periodic values of the average voltage (V-ave) and the corresponding plurality of periodic values of the peak voltage (V-peak) with the waveform power input as being a leading edge phase-cut waveform power input or a trailing edge phase-cut waveform power input.

4. The system of claim 2, wherein the voltage detector is configured for generating the plurality of periodic values of the average voltage (V-ave) the corresponding plurality of periodic values of the peak voltage (V-peak) with the waveform power input as a half-waveform pulsating direct power input being rectified from a full-waveform sinusoidal alternating power input.

5. The system of claim 4, wherein the phase angle (Φ) detector is configured for determining the plurality of periodic values of the phase angle (Φ) of the waveform power input by pairing each one of the plurality of generated periodic values of the ratio (V-ap) with a closely-matching one of a plurality of calculated periodic values for the ratio (V-ap) being determined for a plurality of corresponding periodic values of the phase angle (Φ) according to the following formulas:

for the plurality of periodic values of the phase angle (Φ)    Formula 1

$$\text{as being} < 90°, (V\text{-}ap) = \frac{1 - (\text{cosine}\,\Phi)}{\pi(\text{sine}\,\Phi)}$$

for the plurality of periodic values of the phase angle (Φ)    Formula 2

$$\text{as being} \geq 90°, (V\text{-}ap) = \frac{1 - (\text{cosine}\,\Phi)}{[[\pi]]\,\pi}.$$

6. The system of claim 5, wherein the phase angle (Φ) detector is configured for pairing each one of the plurality of generated periodic values of the ratio (V-ap) with the closely-matching one of the plurality of calculated periodic values for the ratio (V-ap) by using a lookup table of the plurality of calculated periodic values for the ratio (V-ap) being determined for the plurality of corresponding periodic values of the phase angle (Φ) according to Formulas 1 and 2.

7. The system of claim 4, wherein the phase angle (Φ) detector is configured for determining the plurality of periodic values of the phase angle (Φ) of the waveform power input by: iteratively determining a plurality of calculated periodic values for the ratio (V-ap) according to the following Formulas 1 and 2 for a plurality of corresponding periodic values of the phase angle (Φ); and pairing each one of the plurality of generated periodic values of the ratio (V-ap) with a closely-matching one of the plurality of calculated periodic values for the ratio (V-ap):

for the plurality of periodic values of the phase angle (Φ)    Formula 1

$$\text{as being} < 90°, (V\text{-}ap) = \frac{1 - (\text{cosine}\,\Phi)}{\pi(\text{sine}\,\Phi)}$$

for the plurality of periodic values of the phase angle (Φ)    Formula 2

$$\text{as being} \geq 90°, (V\text{-}ap) = \frac{1 - (\text{cosine}\,\Phi)}{[[\pi]]\,\pi}.$$

8. A lighting system, comprising:
a dimmer being configured for performing a phase-cutting operation on a waveform power input including a sinusoidal portion, forming a phase-cut waveform power input;
a power transmission circuit being in electrical communication with the dimmer and configured for being placed in electrical communication with a light emitter, the power transmission circuit being configured for receiving a power control signal for controlled transmission of the phase-cut waveform power input to the light emitter;
a voltage detector for receiving the phase-cut waveform power input, the voltage detector being configured for generating a plurality of periodic values of an average voltage ("V-ave") of the phase-cut waveform power input and for generating a corresponding plurality of periodic values of a peak voltage "(V-peak)" of the phase-cut waveform power input; and
a phase angle (Φ) detector being in signal communication for receiving the periodic values of the average voltage (V-ave) and the peak voltage (V-peak) from the voltage detector, and being configured for: generating a plurality of periodic values each being a ratio ("V-ap") of Hall one of the plurality of periodic values of the average voltage (V-ave) divided by the corresponding one of the plurality of periodic values of the peak voltage (V-peak); and determining a plurality of periodic values of a phase angle (Φ) of the phase-cut waveform power input each corresponding to one of the plurality of periodic values of the ratio (V-ap); and
a power control circuit being configured: for utilizing the plurality of periodic values of the phase angle (Φ) of the phase-cut waveform power input in generating the power control signal; and for sending the power control signal to the power transmission circuit.

9. The system of claim 8, wherein the dimmer is configured for performing either a leading edge phase cut operation or a trailing edge phase cut operation on the waveform power input; and wherein the voltage detector is configured for generating the plurality of periodic values of the average voltage (V-ave) and the corresponding plurality of periodic values of the peak voltage (V-peak) with the phase-cut waveform power input as respectively being either a leading edge phase-cut waveform power input or a trailing edge phase-cut waveform power input.

10. The system of claim 8, wherein the voltage detector is configured for generating the plurality of periodic values of the average voltage (V-ave) the corresponding plurality of periodic values of the peak voltage (V-peak) with the phase-cut waveform power input as a half-waveform pulsating direct power input being rectified from a full-waveform sinusoidal alternating power input.

11. The system of claim 10, wherein the phase angle (Φ) detector is configured for determining the plurality of periodic values of the phase angle (Φ) of the phase-cut waveform power input by pairing each one of the plurality of generated periodic values of the ratio (V-ap) with a closely-matching one of a plurality of calculated periodic values for the ratio (V-ap) being determined for a plurality of corresponding periodic values of the phase angle (Φ) according to the following formulas:

for the plurality of periodic values of the phase angle (Φ)    Formula 1

$$\text{as being} < 90°, (V\text{-}ap) = \frac{1 - (\text{cosine}\,\Phi)}{\pi(\text{sine}\,\Phi)}$$

for the plurality of periodic values of the phase angle (Φ)    Formula 2

$$\text{as being} \geq 90°, (V\text{-}ap) = \frac{1 - (\text{cosine}\,\Phi)}{[[\pi]]\,\pi}.$$

12. The system of claim 11, wherein the phase angle (Φ) detector is configured for pairing each one of the plurality of generated periodic values of the ratio (V-ap) with the closely-matching one of the plurality of calculated periodic values for the ratio (V-ap) by using a lookup table of the plurality of calculated periodic values for the ratio (V-ap) being determined for the plurality of corresponding periodic values of the phase angle (Φ) according to Formulas 1 and 2.

13. The system of claim 10, wherein the phase angle (Φ) detector is configured for determining the plurality of periodic values of the phase angle (Φ) of the phase-cut waveform power input by: iteratively determining a plurality of calculated periodic values for the ratio (V-ap) according to the following Formulas 1 and 2 for a plurality of corresponding periodic values of the phase angle (Φ); and pairing each one of the plurality of generated periodic values of the ratio (V-ap) with a closely-matching one of the plurality of calculated periodic values for the ratio (V-ap):

for the plurality of periodic values of the phase angle (Φ)   Formula 1

$$\text{as being} < 90°, (V\text{-}ap) = \frac{1 - (\text{cosine}\,\Phi)}{\pi(\text{sine}\,\Phi)}$$

for the plurality of periodic values of the phase angle (Φ)   Formula 2

$$\text{as being} \geq 90°, (V\text{-}ap) = \frac{1 - (\text{cosine}\,\Phi)}{[[\pi]]\,\pi}.$$

14. A system for determining periodic values of a phase angle (Φ) of a waveform power input, comprising:
- a voltage detector for receiving a waveform power input including a sinusoidal portion, the voltage detector being configured for generating a plurality of periodic values of a peak voltage "(V-peak)" of the waveform power input and for generating a corresponding plurality of periodic values of an average voltage ("V-ave") of the waveform power input;
- a phase angle (Φ) detector being in signal communication for receiving the periodic values of the average voltage (V-ave) and the peak voltage (V-peak) from the voltage detector, and being configured for: generating a plurality of periodic values each being a ratio ("V-pa") of Hall one of the plurality of periodic values of the peak voltage (V-peak) divided by the corresponding one of the plurality of periodic values of the average voltage (V-ave); and determining a plurality of periodic values of a phase angle (Φ) of the waveform power input each corresponding to one of the plurality of periodic values of the ratio (V-pa);
- a power transmission circuit being configured for being placed in electrical communication with a light emitter, the power transmission circuit being configured for receiving a power control signal for controlled transmission of the waveform power input to the light emitter; and
- a power control circuit being configured: for utilizing the plurality of periodic values of the phase angle (Φ) of the waveform power input in generating the power control signal; and for sending the power control signal to the power transmission circuit.

15. The system of claim 14, wherein the voltage detector is configured for generating the plurality of periodic values of the average voltage (V-ave) and the corresponding plurality of periodic values of the peak voltage (V-peak) with the waveform power input as being a phase-cut waveform power input.

16. The system of claim 15, wherein the voltage detector is configured for generating the plurality of periodic values of the average voltage (V-ave) the corresponding plurality of periodic values of the peak voltage (V-peak) with the waveform power input as being a leading edge phase-cut waveform power input or a trailing edge phase-cut waveform power input.

17. The system of claim 15, wherein the voltage detector is configured for generating the plurality of periodic values of the average voltage (V-ave) the corresponding plurality of periodic values of the peak voltage (V-peak) with the waveform power input as a half-waveform pulsating direct power input being rectified from a full-waveform sinusoidal alternating power input.

18. The system of claim 17, wherein the phase angle (Φ) detector is configured for determining the plurality of periodic values of the phase angle (Φ) of the waveform power input by pairing each one of the plurality of generated periodic values of the ratio (V-pa) with a closely-matching one of a plurality of calculated periodic values for the ratio (V-pa) being determined for a plurality of corresponding periodic values of the phase angle (Φ) according to the following formulas:

for the plurality of periodic values of the phase angle (Φ)   Formula 3

$$\text{as being} > 0 \text{ and} < 90°, (V\text{-}pa) = \frac{\pi(\text{sine}\,\Phi)}{1 - (\text{cosine}\,\Phi)}$$

for the plurality of periodic values of the phase angle (Φ)   Formula 4

$$\text{as being} \geq 90°, (V\text{-}pa) = \frac{\pi}{1 - (\text{cosine}\,\Phi)}.$$

19. The system of claim 18, wherein the phase angle (Φ) detector is configured for pairing each one of the plurality of generated periodic values of the ratio (V-pa) with the closely-matching one of the plurality of calculated periodic values for the ratio (V-pa) by using a lookup table of the plurality of calculated periodic values for the ratio (V-pa) being determined for the plurality of corresponding periodic values of the phase angle (Φ) according to Formulas 3 and 4.

20. The system of claim 17, wherein the phase angle (Φ) detector is configured for determining the plurality of periodic values of the phase angle (Φ) of the waveform power input by: iteratively determining a plurality of calculated periodic values for the ratio (V-pa) according to the following Formulas 3 and 4 for a plurality of corresponding periodic values of the phase angle (Φ); and pairing each one of the plurality of generated periodic values of the ratio (V-pa) with a closely-matching one of the plurality of calculated periodic values for the ratio (V-pa):

for the plurality of periodic values of the phase angle (Φ)   Formula 3

$$\text{as being} > 0 \text{ and} < 90°, (V\text{-}pa) = \frac{\pi(\text{sine}\,\Phi)}{1 - (\text{cosine}\,\Phi)}$$

for the plurality of periodic values of the phase angle (Φ)   Formula 4

$$\text{as being} \geq 90°, (V\text{-}pa) = \frac{\pi}{1 - (\text{cosine}\,\Phi)}.$$

21. A lighting system, comprising:
- a dimmer being configured for performing a phase-cutting operation on a waveform power input including a sinusoidal portion, forming a phase-cut waveform power input;
- a power transmission circuit being in electrical communication with the dimmer and configured for being placed in electrical communication with a light emitter, the power transmission circuit being configured for receiving a power control signal for controlled transmission of the phase-cut waveform power input to the light emitter;
- a voltage detector for receiving the phase-cut waveform power input, the voltage detector being configured for generating a plurality of periodic values of a peak voltage "(V-peak)" of the phase-cut waveform power input and for generating a corresponding plurality of periodic values of an average voltage ("V-ave") of the phase-cut waveform power input; and a phase angle (Φ) detector being in signal communication for receiving the periodic values of the average voltage (V-ave) and the peak voltage (V-peak) from the voltage detector, and being configured for: generating a plurality of periodic values each being a ratio ("V-pa") of one of the plurality of periodic values of the peak voltage (V-peak) divided by the corresponding one of the plurality of periodic values of the average voltage (V-ave); and determining a plurality of periodic values of a phase angle (Φ) of the phase-cut waveform power input each corresponding to one of the plurality of periodic values of the ratio (V-pa); and a power control circuit being configured: for utilizing the plurality of periodic values of the phase angle (Φ) of the phase-cut waveform power input in generating the power control signal; and for sending the power control signal to the power transmission circuit.

22. The system of claim 21, wherein the dimmer is configured for performing either a leading edge phase cut operation or a trailing edge phase cut operation on the waveform power input; and wherein the voltage detector is configured for generating the plurality of periodic values of the average voltage (V-ave) and the corresponding plurality of periodic values of the peak voltage (V-peak) with the phase-cut waveform power input as respectively being either a leading edge phase-cut waveform power input or a trailing edge phase-cut waveform power input.

23. The system of claim 21, wherein the voltage detector is configured for generating the plurality of periodic values of the average voltage (V-ave) the corresponding plurality of periodic values of the peak voltage (V-peak) with the phase-cut waveform power input as a half-waveform pulsating direct power input being rectified from a full-waveform sinusoidal alternating power input.

24. The system of claim 23, wherein the phase angle (Φ) detector is configured for determining the plurality of periodic values of the phase angle (Φ) of the phase-cut waveform power input by pairing each one of the plurality of generated periodic values of the ratio (V-pa) with a closely-matching one of a plurality of calculated periodic values for the ratio (V-pa) being determined for a plurality of corresponding periodic values of the phase angle (Φ) according to the following formulas:

for the plurality of periodic values of the phase angle (Φ)  Formula 3
$$\text{as being} > 0 \text{ and} < 90°, (V\text{-}pa) = \frac{\pi(\text{sine }\Phi)}{1-(\text{cosine }\Phi)}$$

for the plurality of periodic values of the phase angle (Φ)  Formula 4
$$\text{as being} \geq 90°, (V\text{-}pa) = \frac{\pi}{1-(\text{cosine }\Phi)}.$$

25. The system of claim 24, wherein the phase angle (Φ) detector is configured for pairing each one of the plurality of generated periodic values of the ratio (V-pa) with the closely-matching one of the plurality of calculated periodic values for the ratio (V-pa) by using a lookup table of the plurality of calculated periodic values for the ratio (V-pa) being determined for the plurality of corresponding periodic values of the phase angle (Φ) according to Formulas 3 and 4.

26. The system of claim 23, wherein the phase angle (Φ) detector is configured for determining the plurality of periodic values of the phase angle (Φ) of the phase-cut waveform power input by: iteratively determining a plurality of calculated periodic values for the ratio (V-pa) according to the following Formulas 3 and 4 for a plurality of corresponding periodic values of the phase angle (Φ); and pairing each one of the plurality of generated periodic values of the ratio (V-pa) with a closely-matching one of the plurality of calculated periodic values for the ratio (V-pa):

for the plurality of periodic values of the phase angle (Φ)  Formula 3
$$\text{as being} > 0 \text{ and} < 90°, (V\text{-}pa) = \frac{\pi(\text{sine }\Phi)}{1-(\text{cosine }\Phi)}$$

for the plurality of periodic values of the phase angle (Φ)  Formula 4
$$\text{as being} \geq 90°, (V\text{-}pa) = \frac{\pi}{1-(\text{cosine }\Phi)}.$$

27. A process for determining periodic values of a phase angle (Φ) of a waveform power input, comprising:

providing a waveform power input including a sinusoidal portion, and providing a power transmission circuit being in electrical communication with a light emitter, the power transmission circuit being configured for receiving a power control signal for controlled transmission of the waveform power input to the light emitter;

generating a plurality of periodic values of an average voltage ("V-ave") of the waveform power input, and generating a corresponding plurality of periodic values of a peak voltage "(V-peak)" of the waveform power input;

generating a plurality of periodic values each being a ratio ("V-ap") of one of the plurality of periodic values of the average voltage (V-ave) divided by the corresponding one of the plurality of periodic values of the peak voltage (V-peak);

determining a plurality of periodic values of the phase angle (Φ) of the waveform power input each corresponding to flail one of the plurality of periodic values of the ratio (V-ap);

utilizing the plurality of periodic values of the phase angle (Φ) of the waveform power input in generating the power control signal; and sending the power control signal to the power transmission circuit.

28. The process of claim 27, wherein the providing the waveform power input includes providing the waveform power input as being a phase-cut waveform power input.

29. The process of claim 28, wherein the providing the waveform power input includes providing the waveform power input as being a leading edge phase-cut waveform power input or a trailing edge phase-cut waveform power input.

30. The process of claim 28, wherein the providing the waveform power input includes providing the waveform power input as a half-waveform pulsating direct power input being rectified from a full-waveform sinusoidal alternating power input.

31. The process of claim 30, wherein the determining the plurality of periodic values of the phase angle (Φ) of the waveform power input includes pairing each one of the plurality of generated periodic values of the ratio (V-ap) with a closely-matching one of a plurality of calculated periodic values for the ratio (V-ap) being determined for a plurality of corresponding periodic values of the phase angle (Φ) according to the following formulas:

$$\text{for the plurality of periodic values of the phase angle } (\Phi) \quad \text{Formula 1}$$
$$\text{as being} < 90°, \ (V\text{-}ap) = \frac{1 - (\cosine \Phi)}{\pi(\sine \Phi)}$$

$$\text{for the plurality of periodic values of the phase angle } (\Phi) \quad \text{Formula 2}$$
$$\text{as being} \geq 90°, \ (V\text{-}ap) = \frac{1 - (\cosine \Phi)}{[[\pi]]\pi}.$$

32. The process of claim 31, wherein the pairing each one of the plurality of generated periodic values of the ratio (V-ap) with the closely-matching one of the plurality of calculated periodic values for the ratio (V-ap) includes using a lookup table of the plurality of calculated periodic values for the ratio (V-ap) being determined for the plurality of corresponding periodic values of the phase angle ($\Phi$) according to Formulas 1 and 2.

33. The process of claim 30, wherein the determining the plurality of periodic values of the phase angle ($\Phi$) of the waveform power input includes: iteratively determining a plurality of calculated periodic values for the ratio (V-ap) according to the following Formulas 1 and 2 for a plurality of corresponding periodic values of the phase angle ($\Phi$); and pairing each one of the plurality of generated periodic values of the ratio (V-ap) with a closely-matching one of the plurality of calculated periodic values for the ratio (V-ap):

$$\text{for the plurality of periodic values of the phase angle } (\Phi) \quad \text{Formula 1}$$
$$\text{as being} < 90°, \ (V\text{-}ap) = \frac{1 - (\cosine \Phi)}{\pi(\sine \Phi)}$$

$$\text{for the plurality of periodic values of the phase angle } (\Phi) \quad \text{Formula 2}$$
$$\text{as being} \geq 90°, \ (V\text{-}ap) = \frac{1 - (\cosine \Phi)}{[[\pi]]\pi}.$$

34. A lighting process, comprising:
providing a waveform power input including a sinusoidal portion;
providing a dimmer being configured for performing a phase-cutting operation on the waveform power input to form a phase-cut waveform power input, and providing a power transmission circuit being in electrical communication with the dimmer and with a light emitter, the power transmission circuit being configured for receiving a power control signal for controlled transmission of the phase-cut waveform power input to the light emitter;
generating a plurality of periodic values of an average voltage ("V-ave") of the phase-cut waveform power input and generating a corresponding plurality of periodic values of a peak voltage "(V-peak)" of the phase-cut waveform power input;
generating a plurality of periodic values each being a ratio ("V-ap") of one of the plurality of periodic values of the average voltage (V-ave) divided by the corresponding one of the plurality of periodic values of the peak voltage (V-peak);
determining a plurality of periodic values of the phase angle ($\Phi$) of the phase-cut waveform power input each corresponding to one of the plurality of periodic values of the ratio (V-ap);
utilizing the plurality of periodic values of the phase angle ($\Phi$) of the phase-cut waveform power input in generating the power control signal; and
sending the power control signal to the power transmission circuit.

35. The process of claim 34, wherein the providing the dimmer includes providing the dimmer as being configured for performing either a leading edge phase cut operation or a trailing edge phase cut operation on the waveform power input; and wherein the providing the phase-cut waveform power input includes providing the phase-cut waveform power input as respectively being either a leading edge phase-cut waveform power input or a trailing edge phase-cut waveform power input.

36. The process of claim 34, wherein the providing the phase-cut waveform power input includes providing the phase-cut waveform power input as a half-waveform pulsating direct power input being rectified from a full-waveform sinusoidal alternating power input.

37. The process of claim 36, wherein the determining the plurality of periodic values of the phase angle ($\Phi$) of the phase-cut waveform power input includes pairing each one of the plurality of generated periodic values of the ratio (V-ap) with a closely-matching one of a plurality of calculated periodic values for the ratio (V-ap) being determined for a plurality of corresponding periodic values of the phase angle ($\Phi$) according to the following formulas:

$$\text{for the plurality of periodic values of the phase angle } (\Phi) \quad \text{Formula 1}$$
$$\text{as being} < 90°, \ (V\text{-}ap) = \frac{1 - (\cosine \Phi)}{\pi(\sine \Phi)}$$

$$\text{for the plurality of periodic values of the phase angle } (\Phi) \quad \text{Formula 2}$$
$$\text{as being} \geq 90°, \ (V\text{-}ap) = \frac{1 - (\cosine \Phi)}{[[\pi]]\pi}.$$

38. The process of claim 37, wherein the pairing each one of the plurality of generated periodic values of the ratio (V-ap) with the closely-matching one of the plurality of calculated periodic values for the ratio (V-ap) includes using a lookup table of the plurality of calculated periodic values for the ratio (V-ap) being determined for the plurality of corresponding periodic values of the phase angle ($\Phi$) according to Formulas 1 and 2.

39. The process of claim 36, wherein the determining the plurality of periodic values of the phase angle ($\Phi$) of the phase-cut waveform power input includes: iteratively determining a plurality of calculated periodic values for the ratio (V-ap) according to the following Formulas 1 and 2 for a plurality of corresponding periodic values of the phase angle ($\Phi$); and pairing each one of the plurality of generated periodic values of the ratio (V-ap) with a closely-matching one of the plurality of calculated periodic values for the ratio (V-ap):

$$\text{for the plurality of periodic values of the phase angle } (\Phi) \quad \text{Formula 1}$$
$$\text{as being} < 90°, \ (V\text{-}ap) = \frac{1 - (\cosine \Phi)}{\pi(\sine \Phi)}$$

$$\text{for the plurality of periodic values of the phase angle } (\Phi) \quad \text{Formula 2}$$
$$\text{as being} \geq 90°, \ (V\text{-}ap) = \frac{1 - (\cosine \Phi)}{[[\pi]]\pi}.$$

40. A process for determining periodic values of a phase angle ($\Phi$) of a waveform power input, comprising:
providing a waveform power input including a sinusoidal portion, and providing a power transmission circuit being in electrical communication with a light emitter, the power transmission circuit being configured for receiving a power control signal for controlled transmission of the waveform power input to the light emitter;

generating a plurality of periodic values of a peak voltage "(V-peak)" of the waveform power input, and generating a corresponding plurality of periodic values of an average voltage ("V-ave") of the waveform power input;

generating a plurality of periodic values each being a ratio ("V-pa") of one of the plurality of periodic values of the peak voltage (V-peak) divided by the corresponding one of the plurality of periodic values of the average voltage (V-ave);

determining a plurality of periodic values of the phase angle (Φ) of the waveform power input each corresponding to one of the plurality of periodic values of the ratio (V-pa);

utilizing the plurality of periodic values of the phase angle (Φ) of the waveform power input in generating the power control signal; and sending the power control signal to the power transmission circuit.

41. The process of claim 40, wherein the providing the waveform power input includes providing the waveform power input as being a phase-cut waveform power input.

42. The process of claim 41, wherein the providing the waveform power input includes providing the waveform power input as being a leading edge phase-cut waveform power input or a trailing edge phase-cut waveform power input.

43. The process of claim 41, wherein the providing the waveform power input includes providing the waveform power input as a half-waveform pulsating direct power input being rectified from a full-waveform sinusoidal alternating power input.

44. The process of claim 43, wherein the determining the plurality of periodic values of the phase angle (Φ) of the waveform power input includes pairing each one of the plurality of generated periodic values of the ratio (V-pa) with a closely-matching one of a plurality of calculated periodic values for the ratio (V-pa) being determined for a plurality of corresponding periodic values of the phase angle (Φ) according to the following formulas:

for the plurality of periodic values of the phase angle (Φ)     Formula 3
$$\text{as being} > 0 \text{ and} < 90°, (V\text{-}pa) = \frac{\pi(\text{sine } \Phi)}{1 - (\text{cosine } \Phi)}$$

for the plurality of periodic values of the phase angle (Φ)     Formula 4
$$\text{as being} \geq 90°, (V\text{-}pa) = \frac{\pi}{1 - (\text{cosine } \Phi)}.$$

45. The process of claim 44, wherein the pairing each one of the plurality of generated periodic values of the ratio (V-pa) with the closely-matching one of the plurality of calculated periodic values for the ratio (V-pa) includes using a lookup table of the plurality of calculated periodic values for the ratio (V-pa) being determined for the plurality of corresponding periodic values of the phase angle (Φ) according to Formulas 3 and 4.

46. The process of claim 43, wherein the determining the plurality of periodic values of the phase angle (Φ) of the waveform power input includes: iteratively determining a plurality of calculated periodic values for the ratio (V-pa) according to the following Formulas 3 and 4 for a plurality of corresponding periodic values of the phase angle (Φ); and pairing each one of the plurality of generated periodic values of the ratio (V-pa) with a closely-matching one of the plurality of calculated periodic values for the ratio (V-pa):

for the plurality of periodic values of the phase angle (Φ)     Formula 3
$$\text{as being} > 0 \text{ and} < 90°, (V\text{-}pa) = \frac{\pi(\text{sine } \Phi)}{1 - (\text{cosine } \Phi)}$$

for the plurality of periodic values of the phase angle (Φ)     Formula 4
$$\text{as being} \geq 90°, (V\text{-}pa) = \frac{\pi}{1 - (\text{cosine } \Phi)}.$$

47. A lighting process, comprising:

providing a waveform power input including a sinusoidal portion;

providing a dimmer being configured for performing a phase-cutting operation on the waveform power input to form a phase-cut waveform power input, and providing a power transmission circuit being in electrical communication with the dimmer and with a light emitter, the power transmission circuit being configured for receiving a power control signal for controlled transmission of the phase-cut waveform power input to the light emitter;

generating a plurality of periodic values of a peak voltage "(V-peak)" of the phase-cut waveform power input and generating a corresponding plurality of periodic values of an average voltage ("V-ave") of the phase-cut waveform power input;

generating a plurality of periodic values each being a ratio ("V-pa") of one of the plurality of periodic values of the peak voltage (V-peak) divided by the corresponding one of the plurality of periodic values of the average voltage (V-ave);

determining a plurality of periodic values of the phase angle (Φ) of the phase-cut waveform power input each corresponding to one of the plurality of periodic values of the ratio (V-pa);

utilizing the plurality of periodic values of the phase angle (Φ) of the phase-cut waveform power input in generating the power control signal; and sending the power control signal to the power transmission circuit.

48. The process of claim 47, wherein the providing the dimmer includes providing the dimmer as being configured for performing either a leading edge phase cut operation or a trailing edge phase cut operation on the waveform power input; and wherein the providing the phase-cut waveform power input includes providing the phase-cut waveform power input as respectively being either a leading edge phase-cut waveform power input or a trailing edge phase-cut waveform power input.

49. The process of claim 47, wherein the providing the phase-cut waveform power input includes providing the phase-cut waveform power input as a half-waveform pulsating direct power input being rectified from a full-waveform sinusoidal alternating power input.

50. The process of claim 49, wherein the determining the plurality of periodic values of the phase angle (Φ) of the phase-cut waveform power input includes pairing each one of the plurality of generated periodic values of the ratio (V-pa) with a closely-matching one of a plurality of calculated periodic values for the ratio (V-pa) being determined for a plurality of corresponding periodic values of the phase angle (Φ) according to the following formulas:

$$\text{for the plurality of periodic values of the phase angle (Φ)} \quad \text{Formula 3}$$
$$\text{as being} > 0 \text{ and} < 90°, (V\text{-}pa) = \frac{\pi(\sin Φ)}{1 - (\cos Φ)}$$

$$\text{for the plurality of periodic values of the phase angle (Φ)} \quad \text{Formula 4}$$
$$\text{as being} \geq 90°, (V\text{-}pa) = \frac{\pi}{1 - (\cos Φ)}.$$

51. The process of claim 50, wherein the pairing each one of the plurality of generated periodic values of the ratio (V-pa) with the closely-matching one of the plurality of calculated periodic values for the ratio (V-pa) includes using a lookup table of the plurality of calculated periodic values for the ratio (V-pa) being determined for the plurality of corresponding periodic values of the phase angle (Φ) according to Formulas 3 and 4.

52. The process of claim 49, wherein the determining the plurality of periodic values of the phase angle (Φ) of the phase-cut waveform power input includes: iteratively determining a plurality of calculated periodic values for the ratio (V-pa) according to the following Formulas 3 and 4 for a plurality of corresponding periodic values of the phase angle (Φ); and pairing each one of the plurality of generated periodic values of the ratio (V-pa) with a closely-matching one of the plurality of calculated periodic values for the ratio (V-pa):

$$\text{for the plurality of periodic values of the phase angle (Φ)} \quad \text{Formula 3}$$
$$\text{as being} > 0 \text{ and} < 90°, (V\text{-}pa) = \frac{\pi(\sin Φ)}{1 - (\cos Φ)}$$

$$\text{for the plurality of periodic values of the phase angle (Φ)} \quad \text{Formula 4}$$
$$\text{as being} \geq 90°, (V\text{-}pa) = \frac{\pi}{1 - (\cos Φ)}.$$

\* \* \* \* \*